US011349089B2

(12) United States Patent
Park et al.

(10) Patent No.: US 11,349,089 B2
(45) Date of Patent: May 31, 2022

(54) DISPLAY DEVICE

(71) Applicant: Samsung Display Co., Ltd., Yongin-si (KR)

(72) Inventors: Junhyeong Park, Yongin-si (KR); Sangwoo Kim, Yongin-si (KR); Jaemin Shin, Yongin-si (KR); Hyejin Joo, Yongin-si (KR); Jongho Hong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/896,793

(22) Filed: Jun. 9, 2020

(65) Prior Publication Data

US 2020/0403171 A1 Dec. 24, 2020

(30) Foreign Application Priority Data

Jun. 21, 2019 (KR) .................. 10-2019-0074116

(51) Int. Cl.
| H01L 51/00 | (2006.01) |
| H01L 27/32 | (2006.01) |
| H01L 51/52 | (2006.01) |

(52) U.S. Cl.
CPC ........ *H01L 51/0097* (2013.01); *H01L 27/322* (2013.01); *H01L 27/3258* (2013.01); *H01L 27/3276* (2013.01); *H01L 51/5253* (2013.01)

(58) Field of Classification Search
CPC ............. H01L 51/5256; H01L 51/5253; H01L 51/0097; H01L 27/3246; H01L 27/3276; H01L 27/3258; H01L 27/322; H01L 27/3216
See application file for complete search history.

(56) References Cited

U.S. PATENT DOCUMENTS

| 9,799,708 | B2 | 10/2017 | Hong et al. |
| 10,038,163 | B2 | 7/2018 | Kim et al. |
| 10,121,844 | B2 | 11/2018 | Park et al. |
| 10,608,071 | B2 | 3/2020 | Hong et al. |
| 2017/0288168 | A1* | 10/2017 | Kim ................... H01L 27/3276 |

(Continued)

FOREIGN PATENT DOCUMENTS

| EP | 3 223 327 | 9/2017 |
| EP | 3 486 962 | 5/2019 |

(Continued)

*Primary Examiner* — Vongsavanh Sengdara
(74) *Attorney, Agent, or Firm* — Kile Park Reed & Houtteman PLLC

(57) ABSTRACT

A display device includes: a substrate including an island portion and at least one connection portion extending from the island portion; a display unit on the island portion, the display unit including at least one display element; and an encapsulation layer covering the at least one display element and including an inorganic encapsulation layer and an organic encapsulation layer, wherein the display unit includes: at least one organic insulating layer; and an inorganic insulating layer on the at least one organic insulating layer, the inorganic insulating layer having a tip protruding beyond a side surface of the at least one organic insulating layer, in a direction parallel to an upper surface of the substrate, and the inorganic encapsulation layer is alongside the tip of the inorganic insulating layer.

30 Claims, 17 Drawing Sheets

(56) References Cited

U.S. PATENT DOCUMENTS

2018/0114825 A1\* 4/2018 Hong .................... H01L 27/326
2019/0123118 A1\* 4/2019 Shu ........................ H01L 51/56
2020/0176696 A1\* 6/2020 Dai ........................ H01L 51/56

FOREIGN PATENT DOCUMENTS

| EP | 3 588 571 | 1/2020 |
| --- | --- | --- |
| EP | 3 657 561 | 5/2020 |
| EP | 3 660 906 | 6/2020 |
| EP | 3 660 917 | 6/2020 |
| EP | 3 683 855 | 7/2020 |
| EP | 3 706 184 | 9/2020 |
| KR | 10-2017-0063326 | 6/2017 |
| KR | 10-2017-0110209 | 10/2017 |
| KR | 10-2017-0113934 | 10/2017 |
| KR | 10-2017-0128742 | 11/2017 |
| KR | 10-2018-0045968 | 5/2018 |
| KR | 10-2019-0112880 | 10/2019 |

\* cited by examiner

DISPLAY DEVICE

CROSS-REFERENCE TO RELATED APPLICATIONS

This application claims priority to and benefits of Korean Patent Application No. 10-2019-0074116 under 35 U.S.C. § 119, filed on Jun. 21, 2019, in the Korean Intellectual Property Office, the entire contents of which are incorporated herein by reference.

BACKGROUND

1. Technical Field

One or more embodiments relate to a display device, and configuration therefor that encapsulates an included display element to prevent the introduction of impurities and maintain optimized resolution of the display device even as the display device may experience a change in a shape thereof.

2. Description of the Related Art

As display devices which visually display electrical signals have developed, various ones of such devices having excellent characteristics such as reduced thickness, low weight, and low power consumption have been introduced. Flexible display devices which may be bent or rolled have been a focus of research and development, as have been stretchable display devices.

SUMMARY

In the case of a display device, a shape of which may be changed, resolution may deteriorate due to a change of the shape. One or more embodiments may include aspects in which a display device may be capable of realizing high resolution according to a changed shape. However, the disclosure may not be limited to these and other aspects.

Additional aspects will be set forth in part in the description which follows and will be apparent from the description, or may be learned by practice of the embodiments of the disclosure.

According to one or more embodiments, a display device includes: a substrate including an island portion and at least one connection portion extending from the island portion; a display unit on the island portion, the display unit including at least one display element; and an encapsulation layer covering the at least one display element and including an inorganic encapsulation layer and an organic encapsulation layer, wherein the display unit includes: at least one organic insulating layer; and an inorganic insulating layer on the at least one organic insulating layer, the inorganic insulating layer having a tip protruding beyond a side surface of the at least one organic insulating layer, in a direction parallel to an upper surface of the substrate, and the inorganic encapsulation layer may be alongside the tip of the inorganic insulating layer.

The inorganic encapsulation layer may be alongside a bottom surface of the tip of the inorganic insulating layer.

A portion of the inorganic encapsulation layer may extend from the bottom surface of the tip and may cover the side surface of the at least one organic insulating layer and a side surface of the substrate.

The at least one display element may include a first display element emitting red light, a second display element emitting blue light, and a third display element emitting green light, and the tip of the inorganic insulating layer may be around the first display element, the second display element, and the third display element, according to a plan view.

The at least one display element may include a pixel electrode on the inorganic insulating layer, a pixel-defining layer on the pixel electrode, the pixel-defining layer having an opening overlapping the pixel electrode, an intermediate layer having an emission layer overlapping the pixel electrode, and an opposite electrode on the intermediate layer.

The opposite electrode may cover the island portion.

The intermediate layer may include at least one functional layer between the pixel electrode and the opposite electrode.

An area where the inorganic encapsulation layer and the tip of the inorganic insulating layer are alongside each other may be an inorganic contact area that is around the at least one display element.

The display device may further include a spacer on the island portion, wherein a portion of the inorganic contact area is between the spacer and the at least one display element.

The inorganic insulating layer may have a second tip protruding beyond the side surface of the at least one organic insulating layer, the inorganic encapsulation layer may be alongside the second tip of the inorganic insulating layer, and an area where the inorganic encapsulation layer and the second tip of the inorganic insulating layer are alongside each other may be a second inorganic contact area that may be apart from the inorganic contact area and around the spacer, in a plan view.

The display device may further include a power voltage supply line on the island portion, wherein a contact portion between the opposite electrode and the power voltage supply line may be inside an area within the inorganic contact area.

The power voltage supply line may extend from the island portion onto the at least one connection portion.

The display device may further include a second inorganic insulating layer between the island portion and the at least one connection portion, wherein the second inorganic insulating layer covers a portion of an upper surface of the power voltage supply line, and the second inorganic insulating layer may overlap the inorganic contact area.

The substrate may include repeatedly arranged basic units that each include the island portion and the at least one connection portion, and a closed line may be formed between adjacent basic units from among the basic units, wherein the closed line defines a distance area in which portions of the island portion and portions of the at least one connection portion may be absent.

According to one or more embodiments, a display device may include: a substrate; display units on the substrate and being apart from one another; and an encapsulation layer on the display units, the encapsulation layer may include an inorganic encapsulation layer and an organic encapsulation layer, wherein the substrate may include island portions which are apart from one another and connection portions connecting adjacent island portions from among the island portions, and the display units are each arranged on a corresponding island portion among the island portions, wherein a first display unit that may be arranged on a first island portion from among the island portions may include: a pixel circuit that may include a thin-film transistor and a storage capacitor; at least one organic insulating layer on the pixel circuit; an inorganic insulating layer on the at least one organic insulating layer; and a display element that may be electrically connected to the pixel circuit and that may include a pixel electrode, an intermediate layer including an emission layer, and an opposite electrode, wherein the inorganic insulating layer may include a tip protruding beyond a side surface of the at least one organic insulating layer in a direction parallel to an upper surface of the substrate, and the tip may be alongside the inorganic encapsulation layer.

The inorganic encapsulation layer may be alongside a bottom surface of the tip of the inorganic insulating layer.

The inorganic encapsulation layer may extend from the bottom surface of the tip and may cover the side surface of the at least one organic insulating layer and a side surface of the first island portion.

A recess in a thickness direction of the at least one organic insulating layer may be below the tip of the inorganic insulating layer.

The display device may further include a second inorganic insulating layer that may overlap the recess.

A bottom surface of the recess may be on a same plane as an upper surface of the second inorganic insulating layer.

An area where the tip of the inorganic insulating layer and the inorganic encapsulation layer may be alongside each other may be around the display element.

The connection portions may include a first connection portion connecting the first island portion and a second island portion adjacent to the first island portion, and lines electrically connecting the first display unit and a second display unit on the second island portion may be arranged on the first connection portion.

The lines may overlap a portion of the inorganic contact area.

The lines may include a power voltage supply line electrically connected to the opposite electrode.

A contact portion between the power voltage supply line and the opposite electrode may be inside an area within the inorganic contact area.

The display device may further include a spacer on the first island portion, wherein a portion of the inorganic contact area may be between the spacer and the display element.

A portion of the inorganic insulating layer, which may be between the first island portion and the spacer, may include a second tip protruding beyond the side surface of the at least one organic insulating layer in the direction parallel to the upper surface of the substrate, and the inorganic encapsulation layer may directly contact the second tip to form a second inorganic contact area.

The second inorganic contact area may be apart from the inorganic contact area and around the spacer, in a plan view.

The display device may further include a groove between the inorganic contact area and the second inorganic contact area.

Each of the tip and the second tip may protrude towards the center of the groove, and the opposite electrode and at least one organic material layer that may be included in the intermediate layer each may be separated by the tip and the second tip.

BRIEF DESCRIPTION OF THE DRAWINGS

The above and other aspects, features, and advantages of embodiments of the disclosure will be more apparent from the following description when taken in conjunction with the accompanying drawings, in which.

DETAILED DESCRIPTION OF THE EMBODIMENTS

Figure 1:
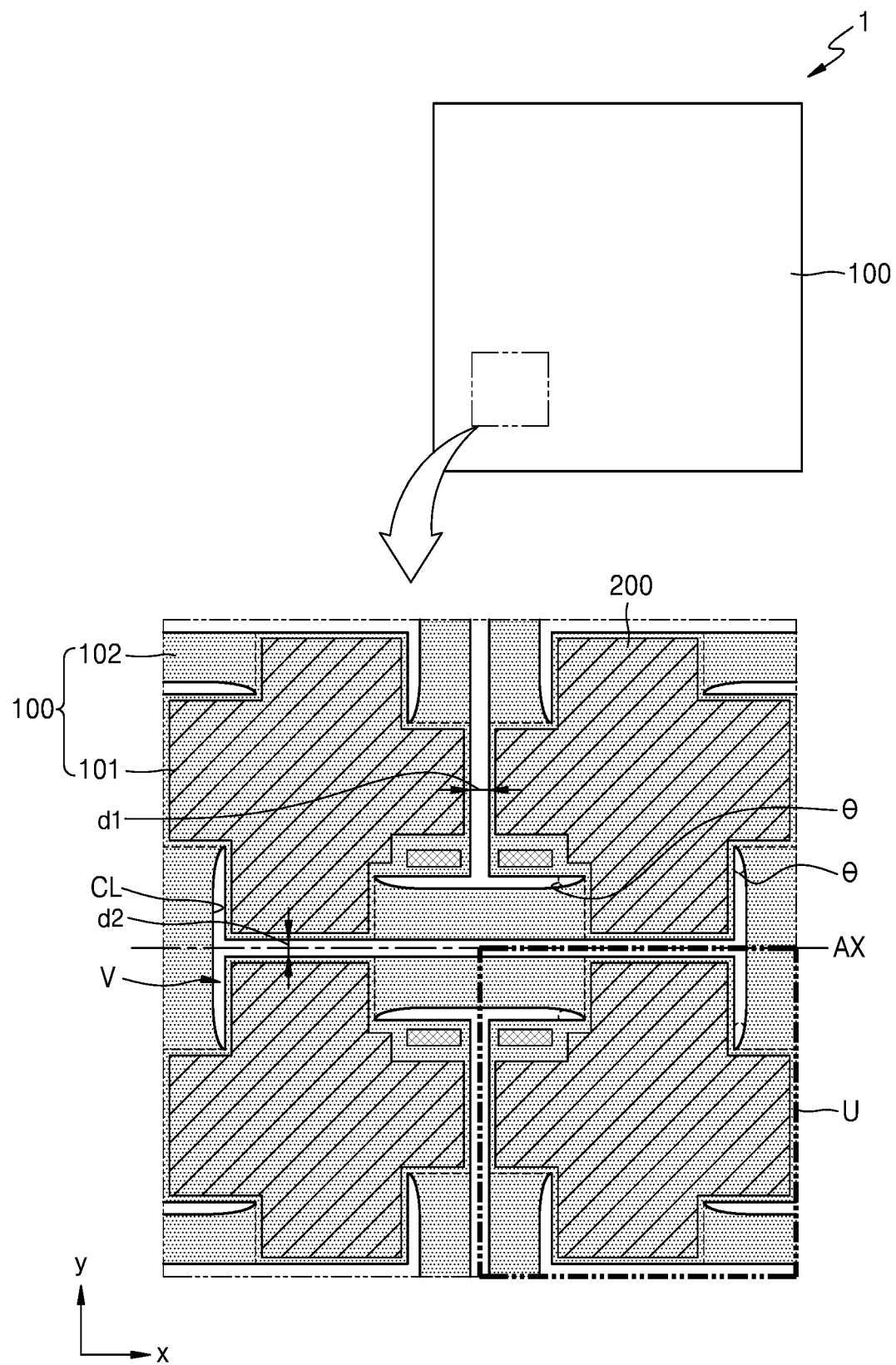
FIG. 1 shows a plan view of a display device according to an embodiment.

Reference will now be made in detail to embodiments, examples of which may be illustrated in the accompanying drawings, wherein like reference numerals refer to like elements throughout. In this regard, the embodiments may have different forms and should not be construed as being limited to the descriptions set forth herein. Accordingly, the embodiments may be described below, by referring to the figures, to explain aspects of the description. As used herein, the term "and/or" includes any and all combinations of one or more of the associated listed items. Expressions such as "at least one of," when preceding a list of elements, modify the entire list of elements and do not modify the individual elements of the list.

It will be understood that the terms "first," "second," etc. may be used herein to describe various components, these components should not be limited by these terms. These terms may only be used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, area, or component is referred to as being "formed on," another layer, area, or component, it can be directly or indirectly formed on the other layer, area, or component. That is, for example, intervening layers, areas, or components may be present.

Sizes of elements in the drawings may be exaggerated for convenience of explanation. In other words, since sizes and thicknesses of components in the drawings may be arbitrarily illustrated for convenience of explanation, the following embodiments may not be limited thereto.

When an embodiment may be implemented differently, a specific process order may be performed differently from the described order. For example, two consecutively described processes may be performed substantially at the same time or performed in an order opposite to the described order.

In the embodiments hereinafter, it will be understood that when an element, an area, or a layer is referred to as being connected to another element, area, or layer, it can be directly or indirectly connected to the other element, area, or layer. For example, it will be understood in this specification that when an element, an area, or a layer is referred to as being in contact with or being electrically connected to another element, area, or layer, it may be directly or indirectly in contact with or electrically connected to the other element, area, or layer.

Further, in the specification, the phrase "in a plan view" means when an object portion is viewed from above, and the phrase "in a cross-sectional view" means when a cross-section taken by vertically cutting an element portion is viewed from the side. Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art. When a layer, region, substrate, or area, is referred to as being "on" another layer, region, substrate, or area, it may be directly on the other region, substrate, or area, or intervening regions, substrates, or areas, may be present therebetween. Conversely, when a layer, region, substrate, or area, is referred to as being "directly on" another layer, region, substrate, or area, intervening layers, regions, substrates, or areas, may be absent therebetween. Further when a layer, region, substrate, or area, is referred to as being "below" another layer, region, substrate, or area, it may be directly below the other layer, region, substrate, or area, or intervening layers, regions, substrates, or areas, may be present therebetween. Conversely, when a layer, region, substrate, or area, is referred to as being "directly below" another layer, region, substrate, or area, intervening layers, regions, substrates, or areas, may be absent therebetween.

Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the description.

Figure 2:
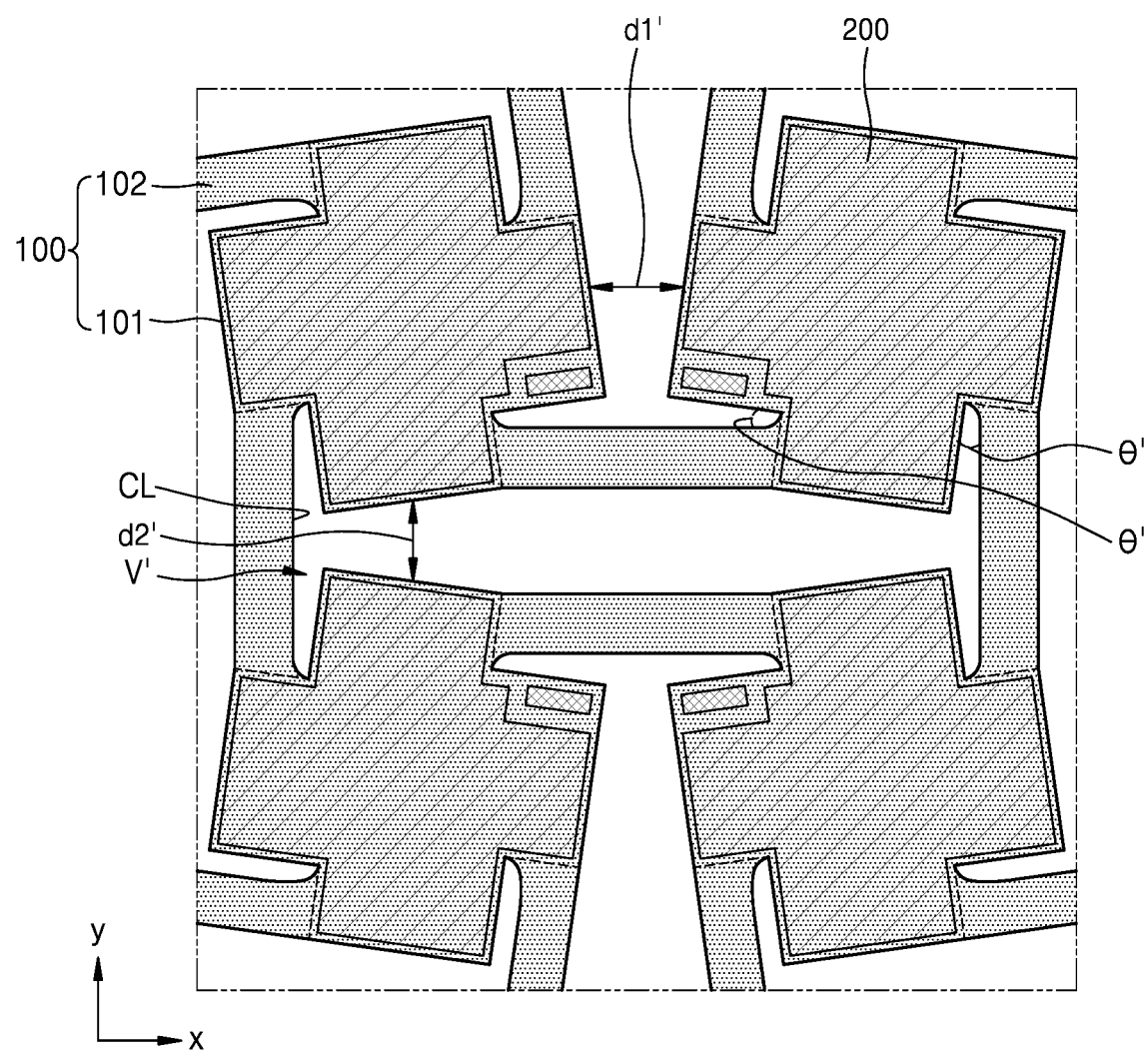
FIG. 2 shows a schematic plan view of an enlarged portion of FIG. 1.

FIG. 1 shows a plan view of a display device 1 according to an embodiment and FIG. 2 is a schematic plan view of an enlarged portion of FIG. 1.

Referring to FIG. 1, the display device 1 may include a substrate 100 and a display unit 200 on the substrate 100.

The substrate 100 may include various materials, such as glass, metal or organic materials. According to an embodiment, the substrate 100 may include a flexible material. For example, the substrate 100 may include ultra-thin flexible glass (for example, a thickness of dozens to hundreds of μm) or polymer resins. When the substrate 100 may include polymer resins, the substrate 100 may include polyimide (PI). As another example, the substrate 100 may include polyethersulfone (PES), polyarylate, polyetherimide (PEI), polyethyelene naphthalate (PEN), polyethylene terephthalate (PET), polyphenylene sulfide (PPS), polycarbonate (PC), cellulose tri-acetate (TAC), and/or cellulose acetate propionate (CAP).

The substrate 100 may include island portions 101 that may be apart from one another, connection portions 102 connecting the island portions 101, and distance areas V among the connection portions 102 and passing through the substrate 100.

The island portions 101 may be arranged in planar grid patterns, so as to be repeatedly arranged in a first direction (i.e., an x direction) and a second direction (i.e., a y direction) that is different from the first direction. The first direction and the second direction may intersect with each other. The first direction and the second direction may form an obtuse angle or an acute angle.

A display unit 200 may be disposed on each of the island portions 101 and may define at least one pixel, and the pixel may include a display element emitting light of a visible light zone. For example, a red pixel, a green pixel, and a blue pixel may be arranged on each of the island portions 101. A red pixel, a green pixel, a blue pixel, and a white pixel may be arranged on each of the island portions 101. A configuration of a corresponding pixel follows below with reference to FIG. 5.

The connection portions 102 may connect the island portions 101 that are adjacent with one another. For example, four connection portions 102 may be connected to each island portion 101. The four connection portions 102 connected to one island portion 101 may each extend in a different direction and each connection portion 102 may be connected to another island portion 101 disposed to be adjacent to the aforementioned island portion 101. For example, one island portion 101 may be connected to four other island portions 101 that are located along a surrounding direction of the aforementioned island portion 101, via the four connection portions 102, respectively.

The island portions 101 and the connection portions 102 may be formed of the same material. For example, the island portions 101 and the connection portions 102 may be integrally formed as a one-piece construction.

One island portion 101 and the connection portions 102 connected thereto may be referred to as a basic unit U. Basic units U may be repeatedly arranged in the first direction and the second direction. For example, the substrate 100 may include the basic units U to be repeatedly arranged and connected to one another. Two adjacent basic units U may be symmetrical. For example, two basic units U adjacent to each other in a left and right direction in FIG. 1 may be vertically symmetrical based on a symmetrical axis which may be between the two basic units U and parallel to the y direction. Similarly, two basic units U adjacent to each other in an upper and lower direction in FIG. 1 may be horizontally symmetrical based on a symmetrical axis AX which may be between the two basic units U and parallel to the x direction.

Adjacent basic units U, for example, the four basic units U illustrated in FIG. 1 may form a closed line CL among the four basic units U. The closed line CL may be an area or portion of the substrate 100 that may be along edges of adjacent island portions 101 and at least one connection portion 102. The closed line CL may define the distance area V, which may be an empty space, i.e., a space in which parts of the island portions 101 and/or the connection portion 102 may be absent. That is, the distance area V may be defined by the closed line CL, such that the distance area V is bounded by the closed line CL.

Each distance area V may pass through an upper surface and a lower surface of the substrate 100. Each distance area V may provide a distance area among the island portions 101, reduce a weight of the substrate 100, and increase the flexibility of the substrate 100 since none of the island portions 101 and connection portions 102 may be present within the distance area V. In a case that an external force (e.g. a winding, bending, or pulling force, etc.) may be applied to the substrate 100, a shape of the distance areas V may be changed to conveniently reduce the stress that may occur to the display device 1 in a case that a configuration of the substrate 100 may be changed according to a shape thereof. As a result, the substrate 100 may be prevented from being abnormally deformed and may have increased durability. Accordingly, user convenience with respect to use of the display device 1 may be improved. Among the many advantages of the above may be an ability for the display device 1 to be conveniently applied to a wearable device.

An angle θ between an edge of the island portion 101 included in one basic unit U and an edge of each connection portion 102 included in the basic unit U may be an acute angle. In a case that an external force, for example, a force of pulling the substrate 100 may be applied, an angle θ' between the edge of the island portion 101 and the edge of each connection portion 102 may be increased (θ'>θ), and an area or a shape of a distance area V' may be changed along with a location of the island portion 101, as illustrated in FIG. 2. FIG. 2 shows a plan view of the substrate 100 extended in the first direction and the second direction. In a case that the described force may be applied to the substrate 100, each island portion 101 may be rotated by a predetermined angle as a result of the change of the angle θ', an increased area and/or the change of shape of the distance area V'. Due to the rotation of each island portion 101, distances between the island portions 101, for example, a first distance d1' and a second distance d2', may be changed depending on a location of each island portion 101.

In a case that a pulling force may be applied to the substrate 100, stress may be concentrated at the connection portions 102 connected to the edges of the island portions 101. Thus, in order to prevent damage to the substrate 100, the closed line CL defining the distance areas V may include a curved line portion.

Figure 3:
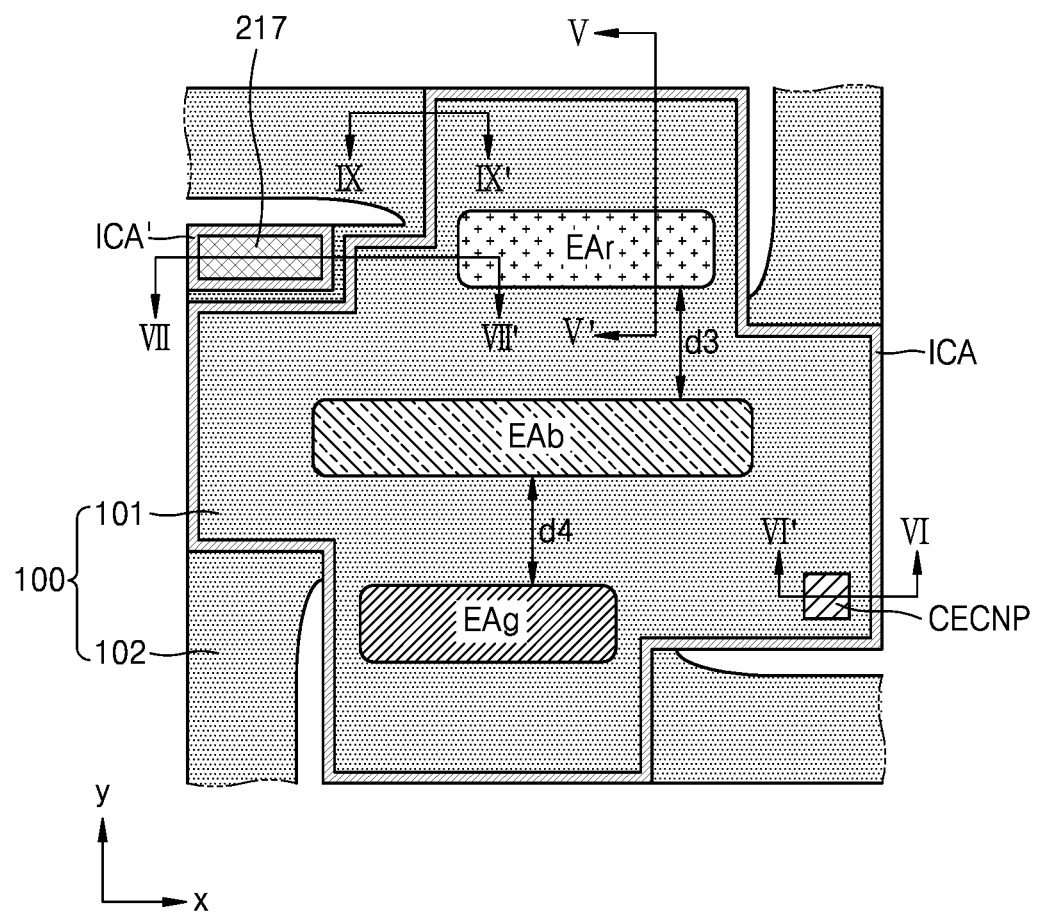
FIG. 3 shows a plan view of a configuration of a basic unit of a display device according to an embodiment.
Figure 4:
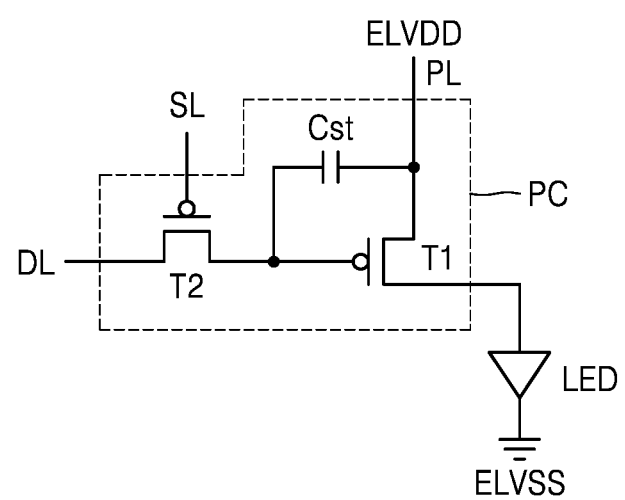
FIG. 4 shows a schematic diagram of an equivalent circuit of any pixel of a display device according to an embodiment.

FIG. 3 shows a plan view of a configuration of a basic unit of a display device according to an embodiment and FIG. 4 shows a schematic diagram of an equivalent circuit of any pixel of a display device according to an embodiment.

Referring to FIG. 3, pixels may be arranged on the island portion 101 of the substrate 100, and each pixel may include a display element. Light emitted from the display element may be provided through an emission area having a predetermined area in a plan view. With respect to this aspect, FIG. 3 shows emission areas of each pixel. For example, a red emission area EAr, a blue emission area EAb, and a green emission area EAg may be located on the island portion 101.

Red, green, and blue pixels each may include a pixel circuit PC and a light-emitting diode LED, which is a display element connected to the pixel circuit PC, as illustrated in FIG. 4. The light-emitting diode LED may include an organic light-emitting diode, an inorganic light-emitting diode, or a quantum dot light-emitting diode. Hereinafter, for convenience of explanation, it will be described that the light-emitting diode LED of each pixel may include an organic light-emitting diode.

The pixel circuit PC may include a first thin-film transistor T1, a second thin-film transistor T2, and a storage capacitor Cst. Each pixel P may emit, for example, red, green, or blue light or red, green, blue, or white light through the light-emitting diode LED. The second thin-film transistor T2 may include a switching thin-film transistor and may be connected to a scan line SL and a data line DL. The second thin-film transistor T2 may transfer a data voltage that may be input from the data line DL to the first thin-film transistor T1 according to a switching voltage that may be input from the scan line SL. The storage capacitor Cst may be connected to the second thin-film transistor T2 and a driving voltage line PL and may store a voltage corresponding to a difference between a voltage received from the second thin-film transistor T2 and a first power voltage ELVDD supplied to the driving voltage line PL.

The first thin-film transistor T1 may include a driving thin-film transistor and may be connected to the driving voltage line PL and the storage capacitor Cst. Also, the first thin-film transistor T1 may control a driving current flowing from the driving voltage line PL through the light-emitting diode LED, in correspondence with a voltage value stored in the storage capacitor Cst. The light-emitting diode LED may emit light having a predetermined brightness based on a driving current. An opposite electrode (for example, a cathode) of the light-emitting diode LED may receive a second power voltage ELVSS.

FIG. 4 shows a case in which the pixel circuit PC includes two thin-film transistors and one storage capacitor. However, the disclosure may not be limited thereto. The number of thin-film transistors and the number of storage capacitors may be modified in various ways according to a design of the pixel circuit PC.

Referring to FIG. 3 again, the red emission area EAr of the red pixel, the blue emission area EAb of the blue pixel, and the green emission area EAg of the green pixel may be arranged to be apart from one another in a given direction. For example, the red emission area EAr, the blue emission area EAb, and the green emission area EAg may be arranged to be apart from one another in a second direction (i.e., a y direction) and distances between the adjacent emission areas may be substantially the same. For example, a distance d3 between the red emission area EAr and the blue emission area EAb may be substantially the same as a distance d4 between the blue emission area EAb and the green emission area EAg.

The red, blue, and green pixels on the island portion 101 may be completely surrounded by an inorganic contact area ICA. In other words, the red, blue, and green pixels may be bordered by the inorganic contact area ICA, such that the inorganic contact area ICA may be around a periphery of the island portion 101 so as to contain the pixels therewithin the inorganic contact area ICA. With respect to this aspect, FIG. 3 illustrates that the red emission area EAr, the blue emission area EAb, and the green emission area EAg are completely surrounded or bordered by the inorganic contact area ICA in a plan view.

The inorganic contact area ICA may be formed by including at least two layers that include an inorganic material and that directly contact each other. In other words, the at least two layers that include an inorganic material may be alongside each other. The inorganic contact area ICA may prevent penetration of external moisture into the display element included in each pixel. The inorganic contact area ICA may extend along the edges of the island portion 101 so as to form a border along those edges, and the pixels may be arranged inside the border that is formed from and by the inorganic contact area ICA.

In a plan view, an opposite electrode contact portion CECNP (hereinafter, referred to as a contact portion) for applying a predetermined voltage to the opposite electrode of each display element may be provided inside a loop of the inorganic contact area ICA. A spacer 217 may be located outside the loop of the inorganic contact area ICA in a plan view. The spacer 217 may be completely bordered by an inorganic contact area ICA' (hereinafter, referred to as a second inorganic contact area), which is different from the inorganic contact area ICA surrounding the pixels. In other words, the second inorganic contact area ICA' may be entirely around a periphery of the spacer 217.

Figure 5:
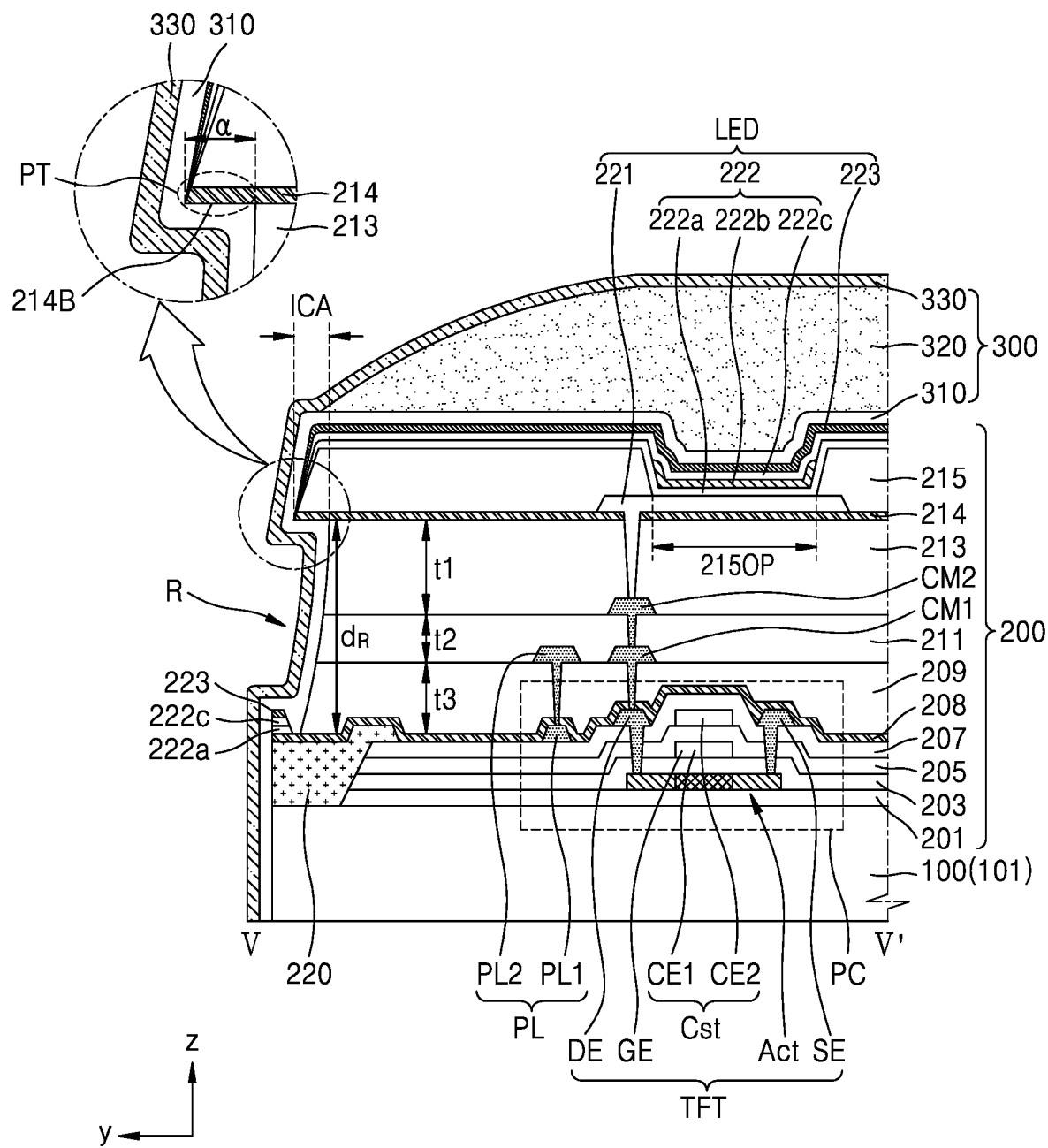
FIG. 5 shows a schematic cross-sectional view of a display device according to an embodiment, and corresponds to a cross-section taken along line V-V' of FIG. 3.

FIG. 5 shows a schematic cross-sectional view of a display device according to an embodiment, and corresponds to a cross-section taken along line V-V' of FIG. 3.

Referring to FIG. 5, the pixel circuit PC and the light-emitting diode LED, which may be the display element electrically connected to the pixel circuit PC, may be arranged on the island portion 101 of the substrate 100. The pixel circuit PC may include the thin-film transistor TFT and the storage capacitor Cst as described with reference to FIG. 4.

A buffer layer 201 may be arranged between the substrate 100 and the pixel circuit PC and may prevent penetration of impurities into the thin-film transistor TFT. The buffer layer 201 may include an inorganic insulating material, such as silicon nitride ($SiN_x$), silicon oxynitride (SiON), and silicon oxide ($SiO_x$), and may include a single layer or multiple layers including the inorganic insulating materials described above.

The thin-film transistor TFT may include a semiconductor layer Act, a gate electrode GE, a source electrode SE, and a drain electrode DE. FIG. 5 illustrates a top gate-type thin-film transistor TFT in which the gate electrode GE may be arranged on the semiconductor layer Act with a gate insulating layer 203 therebetween. However, according to another embodiment, the thin-film transistor TFT may include a bottom gate-type thin-film transistor TFT.

The semiconductor layer Act may include polysilicon. The semiconductor layer Act may include amorphous silicon, an oxide semiconductor, or an organic semiconductor. The gate electrode GE may include a low-resistance metal material. The gate electrode GE may include a conductive material including Mo, Al, Cu, Ti, etc. and may include multiple layers or a single layer including the conductive materials described above.

The gate insulating layer 203 between the semiconductor layer Act and the gate electrode GE may include an inorganic insulating material, such as $SiO_x$, $SiN_x$, SiON, aluminum oxide, titanium oxide, tantalum oxide, and hafnium oxide. The gate insulating layer 203 may include a single layer or multiple layers including the materials described above.

The source electrode SE and the drain electrode DE may be located on the same layer, for example, a second interlayer insulating layer 207, and may include the same material as each other. The source electrode SE and the drain electrode DE may include a highly conductive material. The source electrode SE and the drain electrode DE may include a conductive material including Mo, Al, Cu, Ti, and/or the like, and may include multiple layers or a single layer including the materials described above. According to an embodiment, the source electrode SE and the drain electrode DE may have a multi-layered configuration including a titanium layer, an aluminum layer, and a titanium layer (Ti/Al/Ti).

The storage capacitor Cst may include a lower electrode CE1 and an upper electrode CE2 overlapping or facing each other with a first interlayer insulating layer 205 therebetween. The storage capacitor Cst may overlap or face the thin-film transistor TFT. FIG. 5 shows that the gate electrode GE of the thin-film transistor TFT may be the lower electrode CE1 of the storage capacitor Cst. According to another embodiment, the storage capacitor Cst might not overlap or face the thin-film transistor TFT. The storage capacitor Cst may be covered by a second interlayer insulating layer 207. The upper electrode CE2 of the storage capacitor Cst may include a conductive material including Mo, Al, Cu, Ti, and/or the like, and may include multiple layers or a single layer including the materials described above.

The first interlayer insulating layer 205 and the second interlayer insulating layer 207 may include an inorganic insulating material, such as $SiO_x$, $SiN_x$, and SiON. The first interlayer insulating layer 205 and the second interlayer insulating layer 207 may include a single layer or multiple layers including the materials described above.

Peripheral portions of the buffer layer 201, the gate insulating layer 203, the first interlayer insulating layer 205, and the second interlayer insulating layer 207 may be covered by an organic material layer 220. For example, the organic material layer 220 may cover edges of the buffer layer 201, the gate insulating layer 203, the first interlayer insulating layer 205, and the second interlayer insulating layer 207, which may have step differences, i.e., differences in height, with respect to an upper surface of the substrate 100. The organic material layer 220 may reduce an amount of stress resulting from the inorganic insulating material layers contacting one another around an edge of the substrate 100, i.e., an edge of the island portion 101. The organic material layer 220 may include an organic insulating material, such as PI, and may be located between the second interlayer insulating layer 207 and the first inorganic insulating layer 208.

The thin-film transistor TFT and the storage capacitor Cst may be covered by a first organic insulating layer 209 and a first inorganic insulating layer 208 may be located below the first organic insulating layer 209. The first inorganic insulating layer 208 may include an inorganic insulating layer including an inorganic insulating material, such as $SiN_x$, $SiO_x$, and SiON.

The driving voltage line PL may include a lower driving voltage line PL1 and an upper driving voltage line PL2 electrically connected to each other with the first organic insulating layer 209 therebetween. The lower driving voltage line PL1 may be located on the same layer as the source electrode SE and the drain electrode DE and may include the same material as the source electrode SE and the drain electrode DE. In a case that the driving voltage line PL may be formed as a multi-layered configuration including an insulating layer as described above, an increase in the resistance of the driving voltage line PL may be prevented and a width of the driving voltage line PL may be reduced. According to another embodiment, the driving voltage line PL may include only the lower driving voltage line PL1 or only the upper driving voltage line PL2.

A second organic insulating layer 211 and a third organic insulating layer 213 may be sequentially arranged on the first organic insulating layer 209. The first organic insulating layer 209, the second organic insulating layer 211, and the third organic insulating layer 213 may include an organic insulating material. The organic insulating material may include, for example, a general-purpose polymer such as PMMA or PS, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

A third inorganic insulating layer 214 may be located on the third organic insulating layer 213 and a pixel electrode 221 may be arranged on the third inorganic insulating layer 214. The third inorganic insulating layer 214 may include an inorganic insulating layer including an inorganic insulating material, such as $SiN_x$, $SiO_x$, and SiON.

The pixel electrode 221 may be electrically connected to the thin-film transistor TFT of the pixel circuit PC. FIG. 5 shows that the thin-film transistor TFT and the pixel electrode 221 may be electrically connected to each other via a first contact metal CM1 on the first organic insulating layer 209 and a second contact metal CM2 on the second organic insulating layer 211.

The pixel electrode 221 may include transparent conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). According to another embodiment, the pixel electrode 221 may include a reflective layer including Ag, Mg, Al, Pt, Pd, Au, Ni, Nd, Ir, Cr, and/or a compound thereof. According to another embodiment, the pixel electrode 221 may include a layer including ITO, IZO, ZnO and/or $In_2O_3$ above/below the reflective layer described above. For example, the pixel electrode 221 may include a triple-layered configuration in which an ITO layer, an Ag layer, and an ITO layer may be stacked.

A pixel-defining layer 215 may cover an edge of the pixel electrode 221 and may have an opening 215OP overlapping or facing a central portion of the pixel electrode 221. The opening 215OP of the pixel electrode 221 may define an emission area. For example, a width of the opening 215OP of the pixel electrode 221 may correspond to a width of the red emission area EAr described with reference to FIG. 3. Likewise, and as further examples, each of the blue emission area EAb (FIG. 3) and the green emission area EAg (FIG. 3) may be defined by the width of the opening 215OP of the pixel-defining layer 215 on the pixel electrode 221.

The pixel-defining layer 215 may include an organic insulating material, such as PI. As another example, the pixel-defining layer 215 may include an inorganic insulating material. As another example, the pixel-defining layer 215 may include an organic insulating material and an inorganic insulating material.

An intermediate layer 222 may be arranged on the pixel-defining layer 215. The intermediate layer 222 may include an emission layer 222b. The emission layer 222b may include an organic emission material, such as a high molecular-weight organic material or a low molecular-weight organic material emitting light of a predetermined color. As another example, the emission layer 222b may include an inorganic emission material or quantum dots.

FIG. 5 shows the cross-section taken along the line V-V' passing through the red emission area EAr in FIG. 3, and thus, the emission layer 222b of FIG. 5 may emit red light. The configuration of the light-emitting diode LED shown in FIG. 5 may be uniformly applied to light-emitting diodes included in other pixels. However, a color of light emitted through an emission layer in each pixel may be different, and thus, a specific material of the emission layer in each pixel may be different.

A first functional layer 222a and a second functional layer 222c may be arranged below and above the emission layer 222b, respectively.

The first functional layer 222a may include a single layer or multiple layers. For example, the first functional layer 222a may include a hole transport layer (HTL) having a single-layered configuration and may include poly-(3,4)-ethylene-dihydroxy thiophene (PEDOT) or polyaniline (PANT). As another example, the first functional layer 222a may include a hole injection layer (HIL) and an HTL.

The second functional layer 222c may include a single layer or multiple layers. The second functional layer 222c may include an electron transport layer (ETL) and/or an electron injection layer (EIL).

FIG. 5 shows that the intermediate layer 222 may include both of the first functional layer 222a and the second functional layer 222c. However, according to another embodiment, the intermediate layer 222 may selectively include the first functional layer 222a and the second functional layer 222c. For example, the intermediate layer 222 might not include the second functional layer 222c.

The emission layer 222b of the intermediate layer 222 may be arranged in each pixel. However, the first functional layer 222a and the second functional layer 222c may be formed as a single body to cover multiple pixels. For example, the first functional layer 222a and the second functional layer 222c may be formed as a single body to cover red, blue, and green pixel areas (e.g., EAr, EAb, and EAg in FIG. 3).

The opposite electrode 223 may include a conductive material having a low work function. For example, the opposite electrode 223 may include a (semi) transparent layer including Ag, Mg, Al, Pt, Pd, Au, Ni, Nd, Ir, Cr, Li, Ca, and/or an alloy thereof. As another example, the opposite electrode 223 may further include a layer, such as ITO, IZO, ZnO, or $In_2O_3$, on the (semi) transparent layer including the materials described above. The opposite electrode 223 may be formed as a single body to cover the aforementioned pixels, for example, the red, blue, and green pixel areas (i.e., EAr, EAb, EAg in FIG. 3). For example, the opposite electrode 223 may completely cover the island portion 101 of the substrate 100. An area of the opposite electrode 223 may be different from areas of the first functional layer 222a and the second functional layer 222c described above.

An encapsulation layer 300 may cover an upper portion of the opposite electrode 223. The encapsulation layer 300 may include at least one inorganic encapsulation layer and at least one organic encapsulation layer. According to an embodiment, the encapsulation layer 300 may include a first inorganic encapsulation layer 310, an organic encapsulation layer 320, and a second inorganic encapsulation layer 330 that may be sequentially stacked.

Each of the first and second inorganic encapsulation layers 310 and 330 may include at least one inorganic insulating material. The inorganic insulating material may include aluminum oxide, tantalum oxide, hafnium oxide, zinc oxide, $SiO_x$, $SiN_x$, and/or SiON. The organic encapsulation layer 320 may include a polymer-based material. The polymer-based material may include acryl-based resins, epoxy-based resins, PI, polyethylene and/or the like. The acryl-based resins may include, for example, PMMA, polyacryl acid, etc. The organic encapsulation layer 320 may be located only on a respective island portion 101 of the substrate 100. Thus, it may be understood that the display device 1 described with reference to FIGS. 1 and 2 may include the organic encapsulation layers 320 arranged to be apart from one another on the island portions 101.

The at least one inorganic encapsulation layer of the encapsulation layer 300 may directly contact a portion of the third inorganic insulating layer 214 at a peripheral area of the island portion 101, so as to be alongside each other and to form the inorganic contact area ICA.

A portion of the third inorganic insulating layer 214 may extend in a horizontal direction (i.e., a direction parallel to an upper surface of the substrate). A portion of the third inorganic insulating layer 214 may protrude further in the horizontal direction than a side surface of at least one layer disposed directly below the third inorganic insulating layer 214 to form a tip PT, and the at least one layer may be the third organic insulating layer 213. A recess R, which may be a sunken space with respect to the first organic insulating layer 209, the second organic insulating layer 211, and the third organic insulating layer 213, may be formed below the tip PT, and a depth $d_R$ of the recess R may comprise a thickness t1 that may penetrate at least the third organic insulating layer 213. In an embodiment, the depth $d_R$ of the recess R may correspond to a sum of the thickness t1 that may penetrate at least the third organic insulating layer 213, a thickness t2 of the second organic insulating layer 211, and a thickness t3 of the first organic insulating layer 209. In some embodiments, a depth $d_R$ of the recess R may correspond to the thickness t1 of the third organic insulating layer 213. In some embodiments, a depth $d_R$ of the recess R may correspond to a sum of a thickness t1 of the third organic insulating layer 213 and a thickness t2 of the second organic insulating layer 211.

The recess R may be formed by removing at least one layer disposed below the third inorganic insulating layer 214. For example, FIG. 5 shows that the recess R may be formed by removing peripheral portions of the third organic insulating layer 213, the second organic insulating layer 211, and the first organic insulating layer 209.

The peripheral portions of the third organic insulating layer 213, the second organic insulating layer 211, and the first organic insulating layer 209 may be removed by an etching process. The first inorganic insulating layer 208 may be disposed below the first organic insulating layer 209 and may function as an etch stopper. An upper surface of the first inorganic insulating layer 208 may correspond to a bottom surface of the recess R. An end of the third inorganic insulating layer 214 such as the tip PT, may protrude farther away from the emission area in the horizontal direction than do the side surfaces of the third organic insulating layer 213, the second organic insulating layer 211, and the first organic insulating layer 209. A length α of the tip PT may be several micrometers.

Due to an overhang portion (e.g., an eaves portion and/or an undercut portion) formed by the end of the third inorganic insulating layer 214 protruding beyond the side surface of the third organic insulating layer 213, at least one organic material layer included in the intermediate layer 222, such as the first functional layer 222a and/or the second functional layer 222c, may be disconnected from being on the pixel defining layer 215. The overhang portion described above may be formed before the intermediate layer 222 may be formed. Due to the overhang portion, the organic material layers of the light-emitting diode LED, such as the first functional layer 222a and the second functional layer 222c and which may be integrally formed to cover the emission areas as shown in FIG. 3, may be disconnected from being on the pixel defining layer 215. For example, most portions of each of the first functional layer 222a and the second functional layer 222c may be located on the pixel-defining layer 215, while a residual portion of each of the first and second functional layers 222a and 222c may become disposed adjacent to a bottom surface of the recess R. For example, the residual portion of each of the first and second functional layers 222a and 222c may become disposed on the first inorganic insulating layer 208 during the formation of the first and second functional layers 222a and 222c.

Similarly, the opposite electrode 223 may be disconnected from the pixel defining layer 215, due to the overhang portion. As with the first and second functional layers 222a and 222c, most portions of the opposite electrode 223 may be located on the pixel-defining layer 215. However, a peripheral portion of the opposite electrode 223 may become disposed adjacent to the bottom surface of the recess R. For example, the peripheral portion of the opposite electrode 223 may become disposed on the first inorganic insulating layer 208 during the formation of the opposite electrode 223.

A bottom surface of the end of the third inorganic insulating layer 214 forming the overhang portion, i.e., a bottom surface 214B of the tip PT, may directly contact the at least one inorganic encapsulation layer included in the encapsulation layer 300. In other words, the bottom surface 214B of the tip PT may be alongside the at least one inorganic encapsulation layer included in the encapsulation layer 300. For example, the inorganic contact area ICA may be formed in a case that the first inorganic encapsulation layer 310 of the encapsulation layer 300 directly contacts the bottom surface 214B of the tip PT of the third inorganic insulating layer 214. In other words, the inorganic contact area ICA may be formed such that the first inorganic encapsulation layer 310 covers the tip PT and is alongside the tip PT of the third inorganic insulating layer 214 and meets with the side of the third organic insulating layer 213.

The inorganic contact area ICA may extend to completely surround or be around the emission areas in a plan view (and likewise in a vertical perspective with respect to the upper surface of the substrate), as described above with reference to FIG. 3. The tip PT of the third inorganic insulating layer 214 may extend along a peripheral area of the island portion 101 to completely surround or be around the emission areas. In other words, formation of the tip PT provides a juncture along the peripheral area of the island portion 101 that causes the inorganic contact area ICA to be an outermost boundary of the island portion 101 within which the emission areas are contained. A width of the inorganic contact area ICA may be dependent on a width of the tip PT of the third inorganic insulating layer 214. According to an embodiment, the width of the tip PT may be less than about 2 μm.

Unlike the first functional layer 222a, the second functional layer 222c, and the opposite electrode 223, the first inorganic encapsulation layer 310, which is formed by using chemical vapor deposition, may have relatively excellent step coverage. Thus, the first inorganic encapsulation layer 310 may be formed on the bottom surface 214B with respect to a surface of the substrate 100. The first inorganic encapsulation layer 310 may extend in a downward direction (i.e., a −z direction) from an upper portion of the organic encapsulation layer 320 toward the substrate 100, and may continually extend to cover the bottom surface 214B of the tip PT, the side surfaces of the first through third organic insulating layers 209, 211, and 213, and the side surface of the substrate 100, as is shown in FIG. 5.

Like the first inorganic encapsulation layer 310, the second inorganic encapsulation layer 330 may continually extend from an upper surface of the display device 1 to a side surface of the display device 1 to cover each of those surfaces, so as to prevent, for example, water from being introduced in a lateral direction of the display device 1. For example, the second inorganic encapsulation layer 330 may prevent water penetration through a side surface of the organic material layer 220, and/or the side surfaces of the first through third organic insulating layers 209, 211, and 213.

Figure 6A:
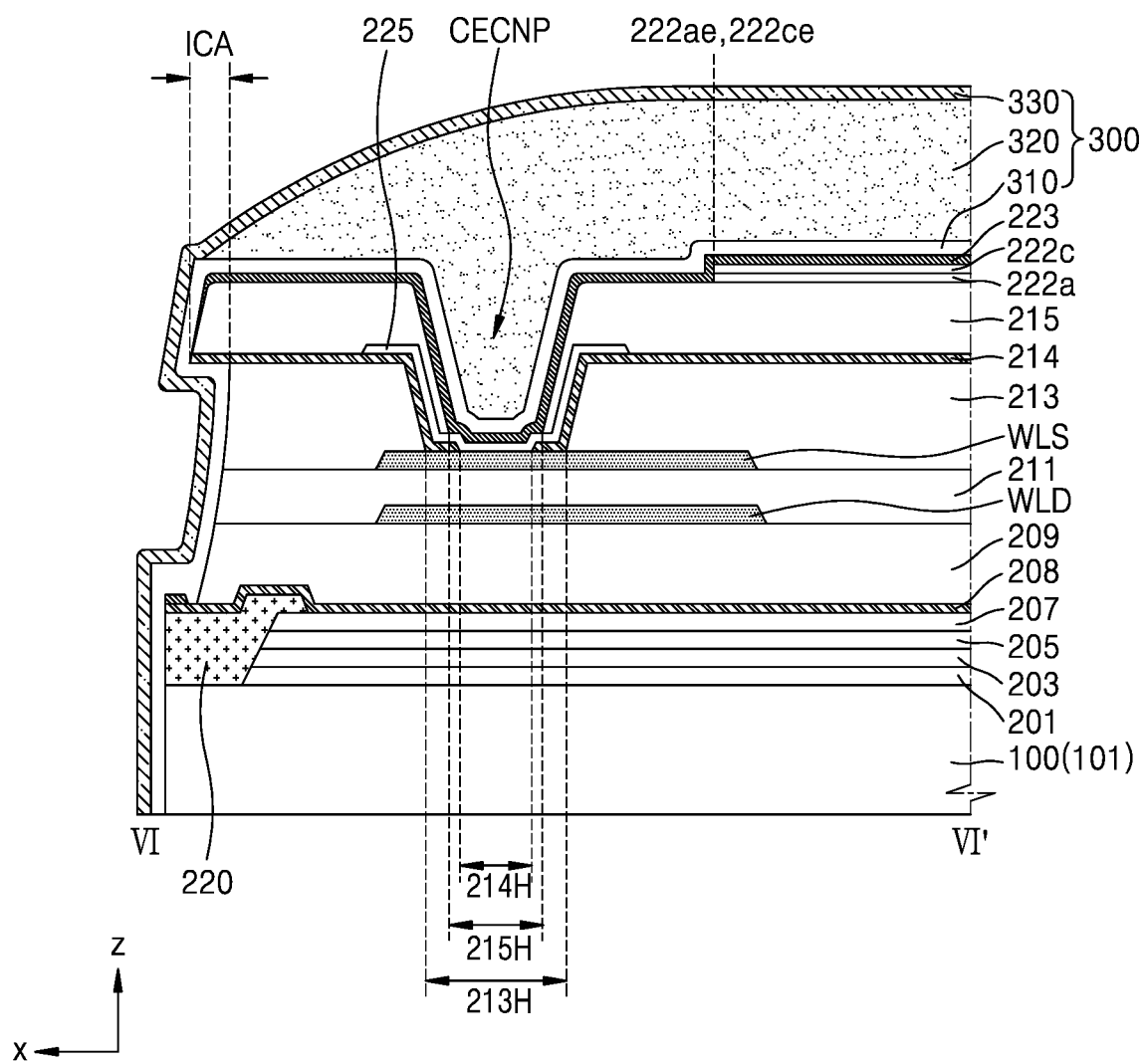
FIG. 6A shows a schematic cross-sectional view of a display device according to an embodiment, and corresponds to a cross-section taken along line VI-VI' of FIG. 3.
Figure 6B:
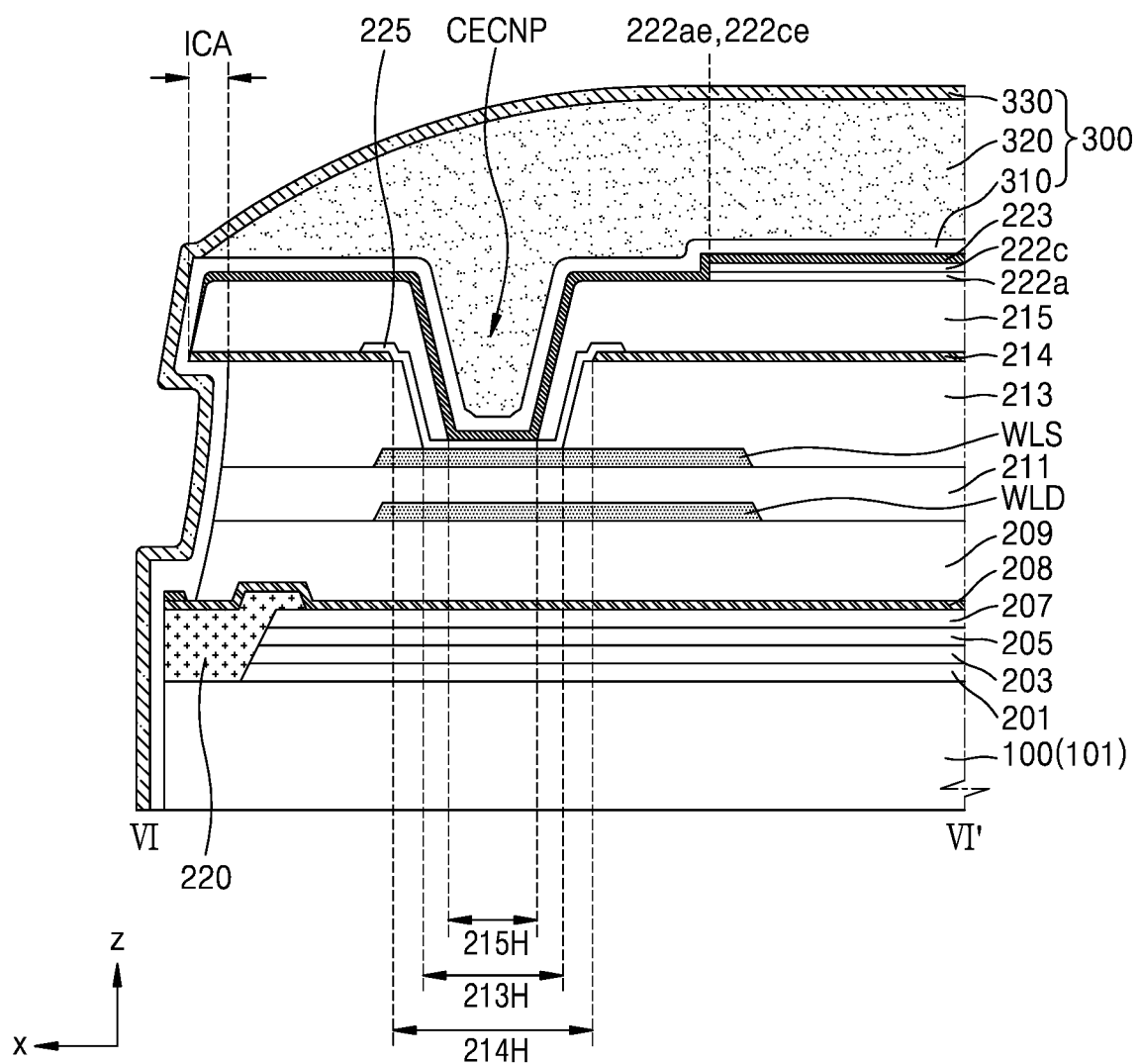
FIG. 6B shows a schematic cross-sectional view of a display device according to an embodiment, and corresponds to a cross-section taken along line VI-VI' of FIG. 3.

FIGS. 6A and 6B show schematic cross-sectional views of a display device according to an embodiment, and correspond to a cross-section taken along line VI-VI' of FIG. 3.

Referring to FIGS. 6A and 6B, a first power voltage supply line WLD and a second power voltage supply line WLS may be arranged on the island portion 101 of the substrate 100. The first power voltage supply line WLD may provide the first power voltage ELVDD (see FIG. 4) and the second power voltage supply line WLS may provide the second power voltage ELVSS.

The first power voltage supply line WLD and the second power voltage supply line WLS may be located on different layers. For example, the first power voltage supply line WLD may be located on the first organic insulating layer 209 and the second power voltage supply line WLS may be located on the second organic insulating layer 211. In a case that the first power voltage supply line WLD and the second power voltage supply line WLS may be arranged on different layers, usage of space on the substrate 100 with respect to the disposition of these lines and intervening layers may be optimized with respect to manufacture of the display device 1.

Although not shown, the first power voltage supply line WLD may be electrically connected to the driving voltage line PL described above with reference to FIG. 5 and may supply the first power voltage EVLDD.

The second power voltage supply line WLS may be electrically connected to the opposite electrode 223. Referring to FIGS. 3, 6A, and 6B, the second power voltage supply line WLS may be electrically connected to the opposite electrode 223 to form the contact portion CECNP. The contact portion CECNP may be located in an inner area of the island portion 101 around which the inorganic contact area ICA is disposed.

Layers between the second power voltage supply line WLS and the opposite electrode 223 may include holes to form the contact portion CECNP. For example, the third organic insulating layer 213 may include a first hole 213H overlapping or facing the second power voltage supply line WLS. The third inorganic insulating layer 214 may include a second hole 214H, and the pixel-defining layer 215 may include a third hole 215H. The first hole 213H, the second hole 214H, and the third hole 215H may overlap or face one another.

A connection electrode 225 may be arranged on the third inorganic insulating layer 214 and the second power voltage supply line WLS and the opposite electrode 223 may be electrically connected to each other via the connection electrode 225. The connection electrode 225 may be connected to the second power voltage supply line WLS via the first hole 213H of the third organic insulating layer 213 and the second hole 214H the third inorganic insulating layer 214, and the opposite electrode 223 may be connected to the connection electrode 225 via the third hole 215H of the pixel-defining layer 215.

A width of the contact portion CECNP may be defined according to a hole having the lesser of widths from among widths of the first hole 213H, the second hole 214H, and the third hole 215H. According to an embodiment, FIG. 6A shows that the second hole 214H may have a width less than a width of the third hole 215H and the third hole 215H may have a width less than a width of the first hole 213H. According to another embodiment, as illustrated in FIG. 6B, the second hole 214H may have a width that may be greater than a width of the first hole 213H. In a case that the second hole 214H may have such a greater width, the connection electrode 225 may directly contact a side surface of the third organic insulating layer 213 defining the first hole 213H. According to another embodiment, the second hole 214H may have a width that is greater than a width of the third hole 215H and a width of the third hole 215H may be greater than a width of the first hole 213H.

The first functional layer 222a and the second functional layer 222c that are each below the opposite electrode 223 may not cover the contact portion CECNP. For example, edges 222ae and 222ce of the first functional layer 222a and the second functional layer 222c may be apart from the inorganic contact area ICA by a distance with the contact portion CECNP therebetween.

Figure 7:
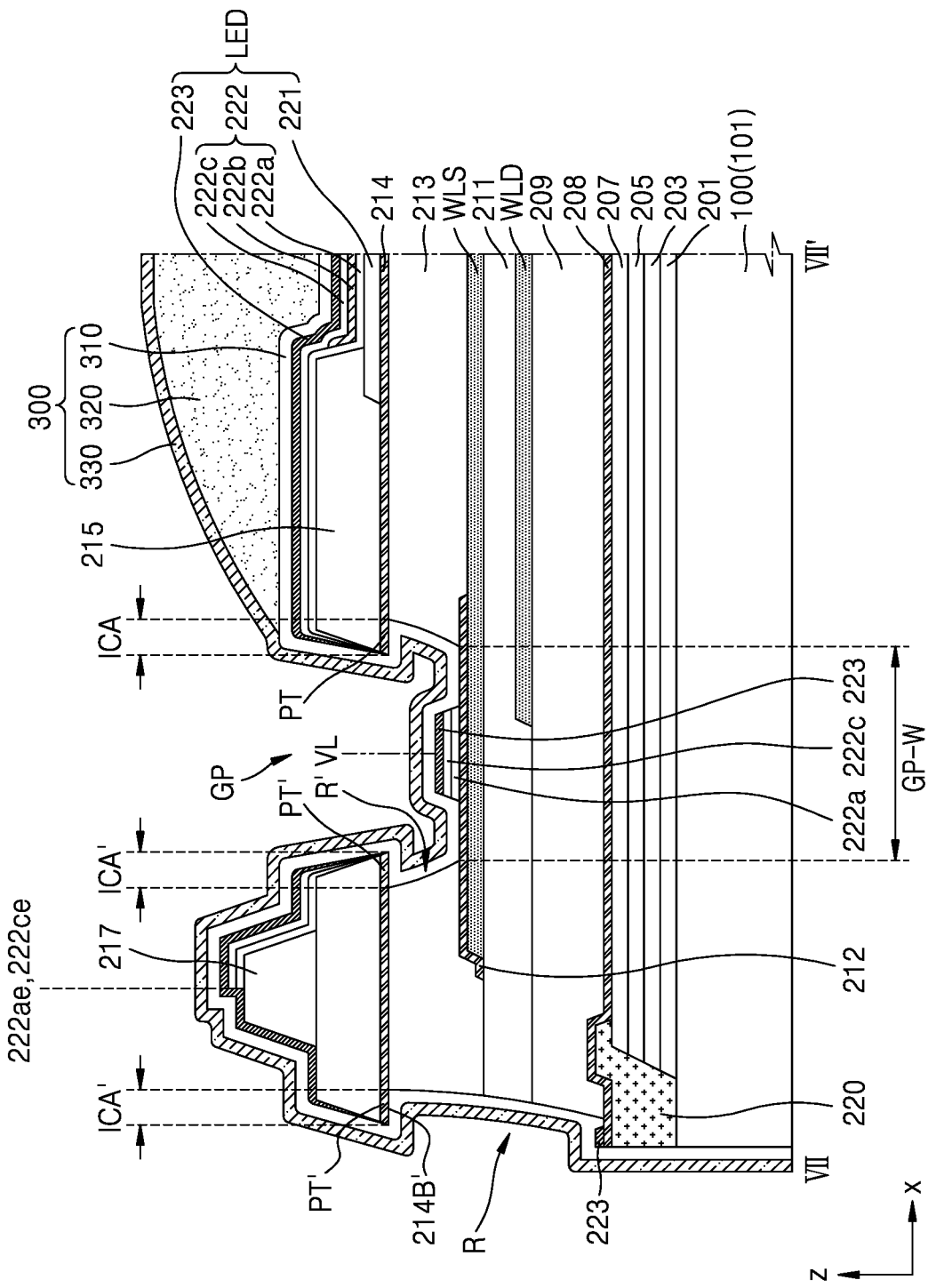
FIG. 7 shows a schematic cross-sectional view of a display device according to an embodiment, and corresponds to a cross-section taken along line VII-VII' of FIG. 3.
Figure 8:
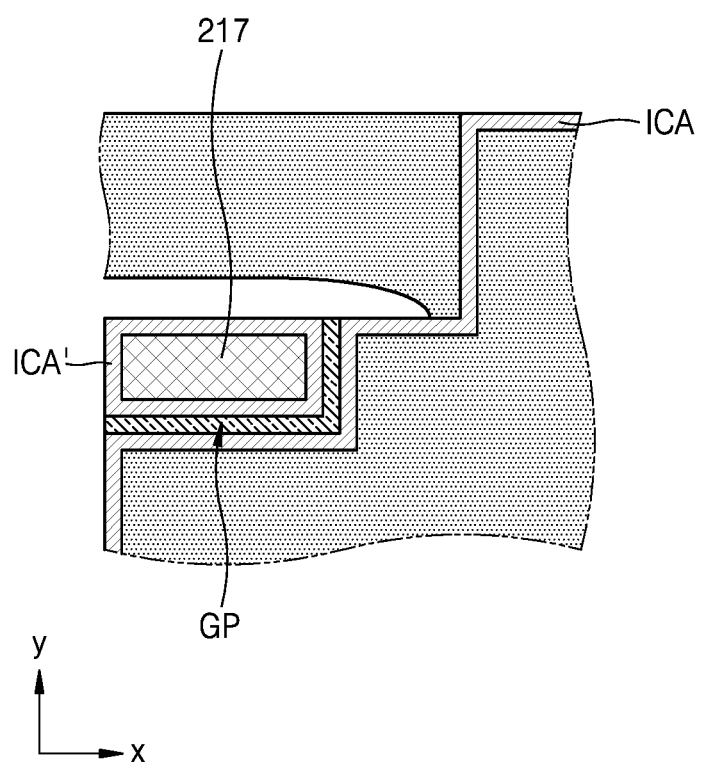
FIG. 8 shows an enlarged plan view of a portion of a display device according to an embodiment.

FIG. 7 shows a schematic cross-sectional view of a display device according to an embodiment and corresponds to a cross-section taken along line VII-VII' of FIG. 3 and FIG. 8 shows an enlarged plan view of a portion of a display device according to an embodiment.

Referring to FIGS. 3 and 7, a spacer 217 may be located on the island portion 101 of the substrate 100. The spacer 217 may be located between the inorganic contact area ICA and an edge of the island portion 101. The spacer 217 may prevent a configuration of the display device 1 including layers disposed below the spacer 217 from being damaged by masks which may be used in a process of forming the intermediate layer 222 and the opposite electrode 223.

A size of an opening area of the mask for forming the intermediate layer 222 and a size of an opening area of the mask for forming the opposite electrode 223 may be different from each other. For example, the opening area of the mask for forming the first functional layer 222*a* and the second functional layer 222*c* may be less than the opening area of the mask for forming the opposite electrode 223. Each of the first functional layer 222*a* and the second functional layer 222*c* may have areas to cover the emission areas on the island portion 101 of the substrate 100, as described above with reference to FIGS. 6A and 6B. For example, as illustrated in FIG. 7, each of the edges 222*ae* and 222*ce* of the first functional layer 222*a* and the second functional layer 222*c* may be located on an upper surface of the spacer 217, and an end of the opposite electrode 223 may extend further toward an edge of the substrate 100 than the edges 222*ae* and 222*ce* of the first functional layer 222*a* and the second functional layer 222*c*.

The spacer 217 may include an organic insulating material, such as PI. The spacer 217 may include the same material and may be formed in a same mask process that may be used for forming the pixel-defining layer 215. The spacer 217 may be surrounded by the second inorganic contact area ICA' as illustrated in FIG. 3. In other words, the inorganic contact area ICA' may be around a periphery of the spacer 217. The second inorganic contact area ICA' may be formed similarly to the inorganic contact area ICA described above with reference to FIG. 5.

For example, ends of the third inorganic insulating layer 214 may extend in a width direction of the spacer 217, i.e., a horizontal direction parallel to an upper surface of the substrate 100, and may protrude further in the horizontal direction than does at least one layer below the third inorganic insulating layer 214 to form tips PT'. For example, as shown at the left portion of the spacer 217 of FIG. 7, an end of the third inorganic insulating layer 214 may extend, in the horizontal direction, further from the spacer 217 than side surfaces of the first through third organic insulating layers 209, 211, and 213, to form an overhang portion. Also, as shown at the right portion of the spacer 217 of FIG. 7, an end of the third inorganic insulating layer 214 may extend, in the horizontal direction, further from the spacer 217 than the side surface of the third organic insulating layer 213, to form an overhang portion. In other words, the third inorganic insulating layer 214 may extend beyond facing portions of the side surface of the third organic insulating layer 213 to form the tips PT'. An end of the third inorganic insulating layer 214, for example, a bottom surface 214B' of the tip PT' may directly contact the first inorganic encapsulation layer 310 to form the second inorganic contact area ICA'. In other words, the bottom surface 214B' of the tip PT' may be alongside the first inorganic encapsulation layer 310 to form the second inorganic contact area ICA'.

The inorganic contact area ICA and the second inorganic contact area ICA' may be apart from each other as illustrated in FIGS. 3 and 7 and there may be a gap portion GP between the inorganic contact area ICA and the second inorganic contact area ICA'. The gap portion GP may form a groove, at both sides of which the overhang portions of the inorganic contact area ICA and the second inorganic contact area ICA' are formed, relative to an imaginary line VL passing the center of the gap portion GP. The gap portion GP may extend along edges of the inorganic contact area ICA and the second inorganic contact area ICA', and between the inorganic contact area ICA and the second inorganic contact area ICA', as illustrated in FIG. 8.

As illustrated in FIG. 7, the overhang portion may be formed at each side of the gap portion GP. For example, the tips PT and PT' may be formed since the ends of the third inorganic insulating layer 214 may protrude further toward the center of the gap portion GP than the side surfaces of the third organic insulating layer 213 that are below the third inorganic insulating layer 214. The inorganic contact area ICA and the second inorganic contact area ICA' may be respectively formed since the bottom surfaces of the tips PT and PT' may directly contact the first inorganic encapsulation layer 310. In other words, the inorganic contact area ICA and the second inorganic contact area ICA' may be respectively formed since the bottom surfaces of the tips PT and PT' may be alongside the first inorganic encapsulation layer 310.

As described above, the first functional layer 222*a*, the second functional layer 222*c*, and the opposite electrode 223 may be disconnected from being on the pixel defining layer 215 due to the overhang portions at both sides of the gap portion GP.

A recess R' corresponding to each of the overhang portions at both sides of the gap portion GP, and the recess R formed along the edge of the island portion 101 may be formed together, i.e., simultaneously. However, the recesses R' corresponding to the overhang portions at both sides of the gap portion GP may be prevented from extending entirely through the third organic insulating layer 213, due to formation of the second inorganic insulating layer 212 at the gap portion GP. The second inorganic insulating layer 212 may have a width greater than a width GP-W of a bottom surface of the gap portion GP. The second inorganic insulating layer 212 may function, for example, as an etch stopper in a process of forming the overhang portions and the recesses R'. The second inorganic insulating layer 212 may include an inorganic insulating layer including an inorganic insulating material, such as $SiN_x$, SiOx, and SiON.

Figure 9:
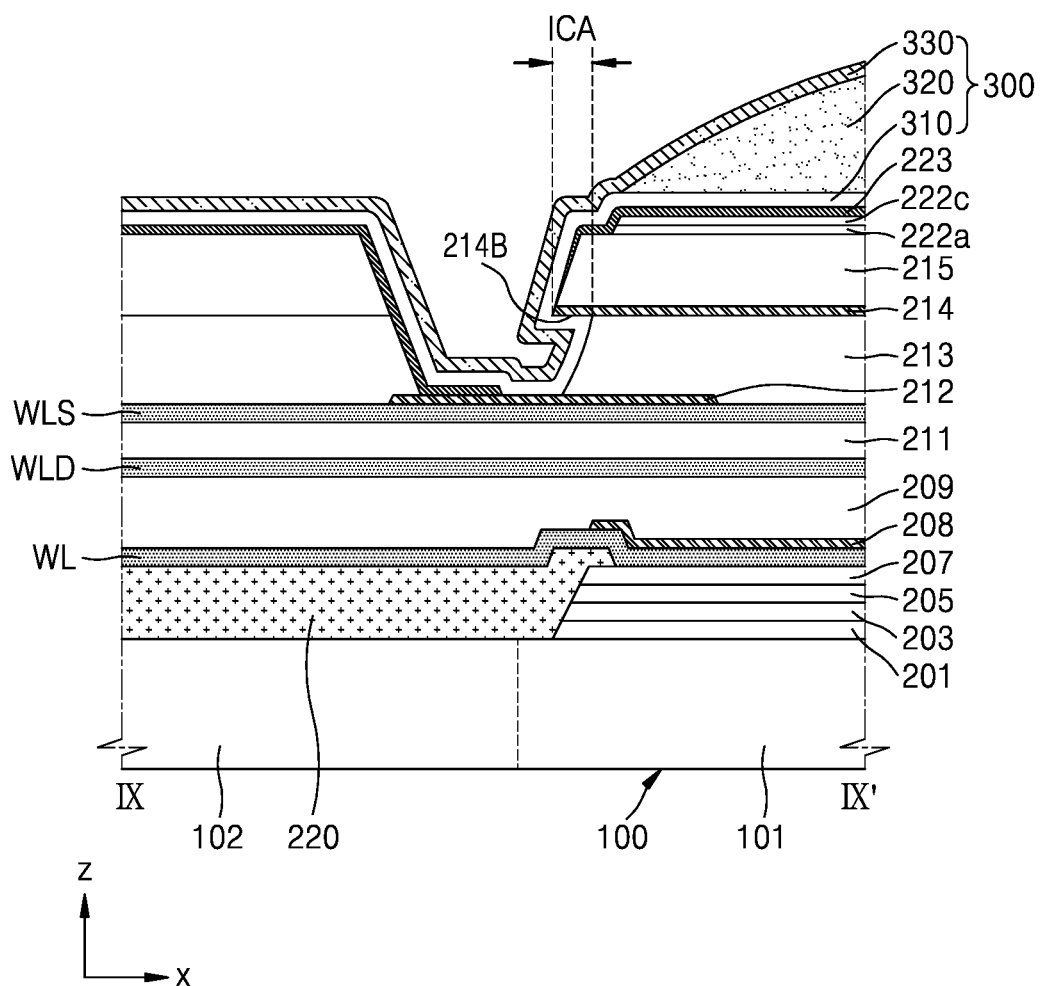
FIG. 9 shows a schematic cross-sectional view of a display device according to an embodiment, and corresponds to a cross-section taken along line IX-IX' of FIG. 3.
Figure 10:
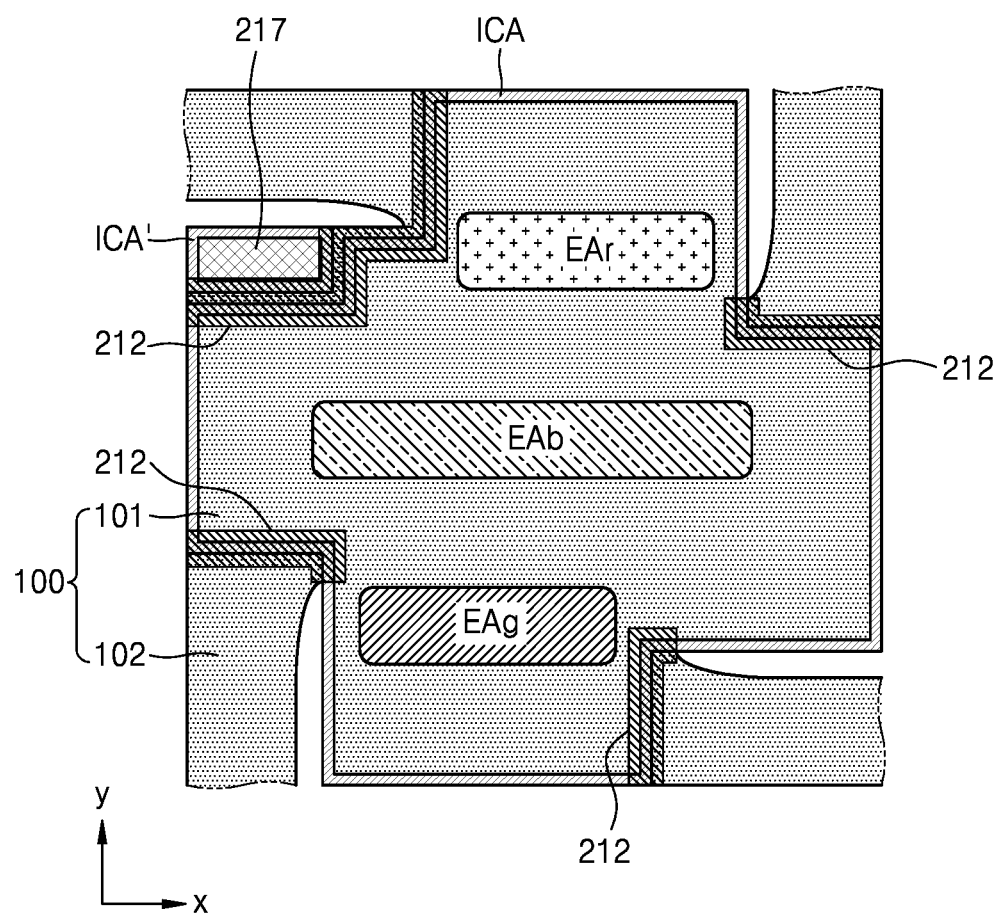
FIG. 10 shows a plan view of inorganic contact areas and a second passivation layer of a display device according to an embodiment.

FIG. 9 shows a schematic cross-sectional view of a display device according to an embodiment and corresponds to a cross-section taken along line IX-IX' of FIG. 3 and FIG. 10 shows a plan view of inorganic contact areas and a second passivation layer of a display device according to an embodiment.

Referring to FIG. 9, the island portion 101 and the connection portion 102 of the substrate 100 may be integrally formed similarly as in FIGS. 5 and 7. A first power voltage supply line WLD and a second power voltage supply line WLS providing a first power voltage and a second power voltage respectively to a pixel circuit and the opposite electrode 223 on the island portion 101 may extend onto the connection portion 102. A signal line WL may be connected to the pixel circuit PC and may apply a data signal and/or a scan signal to the pixel circuit PC while extending from the island portion 101 onto the connection portion 102. For example, the signal line WL may include a data line and/or a scan line.

The first organic insulating layer 209 may support the first power voltage supply line WLD and may extend from the island portion 101 onto the connection portion 102. Likewise, the second organic insulating layer 211 may support the second power voltage supply line WLS and may extend from the island portion 101 onto the connection portion 102. The signal line WL may be located below the first organic insulating layer 209.

An inorganic insulating layer on the island portion 101 may not extend onto the connection portion 102. For example, edges of the buffer layer 201, the gate insulating layer 203, the first interlayer insulating layer 205, and the second interlayer insulating layer 207 may be located on the island portion 101 and may be covered by the organic material layer 220. Similarly, the first inorganic insulating layer 208 and the third inorganic insulating layer 214 may not extend onto the connection portion 102.

As illustrated in FIGS. 3 and 9, the inorganic contact area ICA may be located on the island portion 101 adjacent to the connection portion 102. As described above with reference to the enlarged view of FIG. 5, the inorganic contact area ICA may be formed, because the end of the third inorganic insulating layer 214 having the overhang portion, for example, the bottom surface 214B of the tip PT, contacts the first inorganic encapsulation layer 310. The third inorganic insulating layer 214 may not be located on the connection portion 102.

The first functional layer 222a and the second functional layer 222c may be located on the island portion 101 and may not extend onto the connection portion 102. However, the opposite electrode 223 may be located on the island portion 101 and the connection portion 102 and may be disconnected from being on the pixel defining layer 215 due to the overhang portion formed by the tip PT of the third inorganic insulating layer 214. According to another embodiment, the opposite electrode 223 may not be located on the connection portion 102, in a case that a size of an opening area of a mask for forming the opposite electrode 223 may be adjusted to not cover the connection portion 102.

In order to prevent damage to the second power voltage supply line WLS in a process (for example, an etching process) for forming the overhang portion where an end of the third inorganic insulating layer 214 protrudes beyond the side surface of the third organic insulating layer 213, the second inorganic insulating layer 212 may be located on the second power voltage supply line WLS. At least a portion of the second inorganic insulating layer 212 may overlap or face the inorganic contact area ICA. For example, as illustrated in FIG. 10, the second inorganic insulating layer 212 may be located between the island portion 101 and each connection portion 102, and a portion of the second inorganic insulating layer 212 may overlap or face the inorganic contact area ICA.

While the organic encapsulation layer 320 of the encapsulation layer 300 is located only on each island portion 101, the first and second inorganic encapsulation layers 310 and 330 may be continually formed to be located on the island portion 101 and the connection portion 102. The first and second inorganic encapsulation layers 310 and 330 may contact and be alongside the bottom surface 214B of the tip PT to form the inorganic contact area ICA, and may continually extend to contact each other on the connection portion 102.

According to embodiments described with reference to FIGS. 1 to 9, the encapsulation layer 300 may include the first and second inorganic encapsulation layers 310 and 330 and the organic encapsulation layer 320. However, in an embodiment, the organic encapsulation layer 320 of the encapsulation layer 300 may be omitted. For example, the encapsulation layer 300 may include only one or more inorganic encapsulation layers. However, the embodiments of the encapsulation layer 300 are not limited thereto.

FIG. 9 shows a schematic cross-sectional configuration between the island portion 101 and any one of the four connection portions 102 illustrated in FIG. 3. However, embodiments may not be limited thereto. Configurations between the island portion 101 and the other connection portions 102 illustrated in FIG. 3 may be the same as the configuration described above with reference to FIG. 9.

Figure 11:
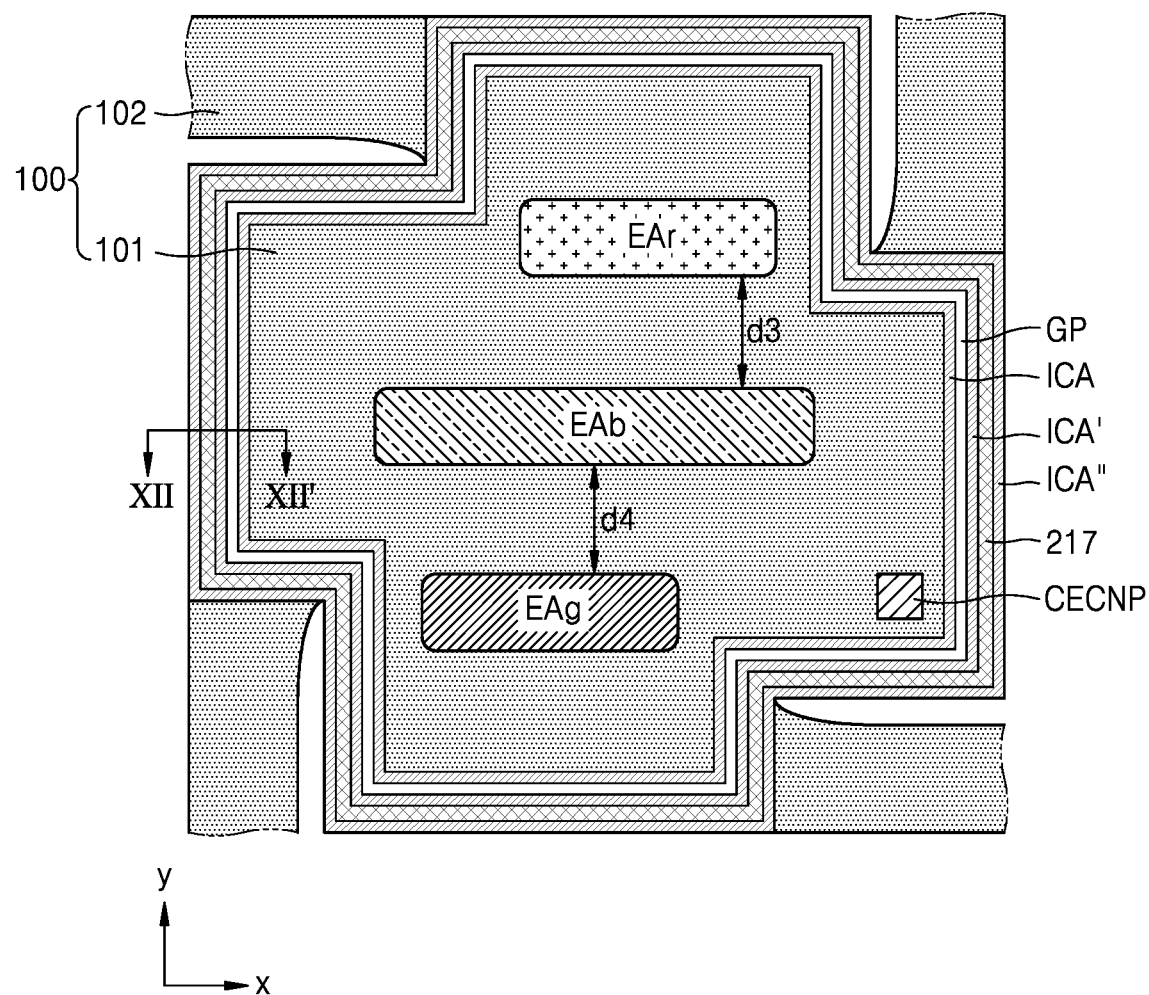
FIG. 11 is a plan view of a structure of a basic unit of a display device according to an embodiment.

FIG. 11 is a plan view of a structure of a basic unit of a display device according to an embodiment.

Referring to FIG. 11, pixels may be arranged on the island portion 101 of the substrate 100, and each pixel may include a display element. Light emitted from the display element may be provided through the emission area having a predetermined area in a planar perspective. For example, as illustrated in FIG. 11, the red emission area EAr, the blue emission area EAb, and the green emission area EAg may be located or disposed on the island portion 101 at predetermined distances from each other.

The substrate 100 may include connection portions 102 that may be formed integrally with the island portion 101 described above and extending from an edge or edges of the island portion 101. A detailed structure thereof is as described above.

In a planar perspective, the island portion 101 may be entirely surrounded by the spacer 217, and the gap portion GP may be arranged inside or alongside the spacer 217.

The inorganic contact area (hereinafter, referred to as a first inorganic contact area ICA) may be arranged inside or alongside the gap portion GP, and another inorganic contact area (hereinafter, referred to as a second inorganic contact area ICA') may be arranged outside the gap portion GP. The first inorganic contact area ICA and the second inorganic contact area ICA' may be spaced apart from each other with the gap portion GP therebetween.

A third inorganic contact area ICA" may be spaced apart from the second inorganic contact area ICA' with the spacer 217 therebetween. Emission areas, for example, the red emission area EAr, the blue emission area EAb, and the green emission area EAg may be surrounded or entirely surrounded by the first to third inorganic contact areas ICA, ICA', and ICA".

A distance between the emission areas may be constant, and a contact portion (or, for example, an opposite electrode contact portion CECNP) for applying a predetermined or selected voltage to an opposite electrode of each display element may be provided inside the inorganic contact area ICA, as described above. For example, a distance d3 between the red emission area EAr and the blue emission area EAb may be substantially equal to a distance d4 between the blue emission area EAb and the green emission area EAg. However, the distances are not limited thereto. The opposite electrode contact portion CECNP may be located or disposed inside the island portion 101 adjacent to the first inorganic contact area ICA.

Figure 12:
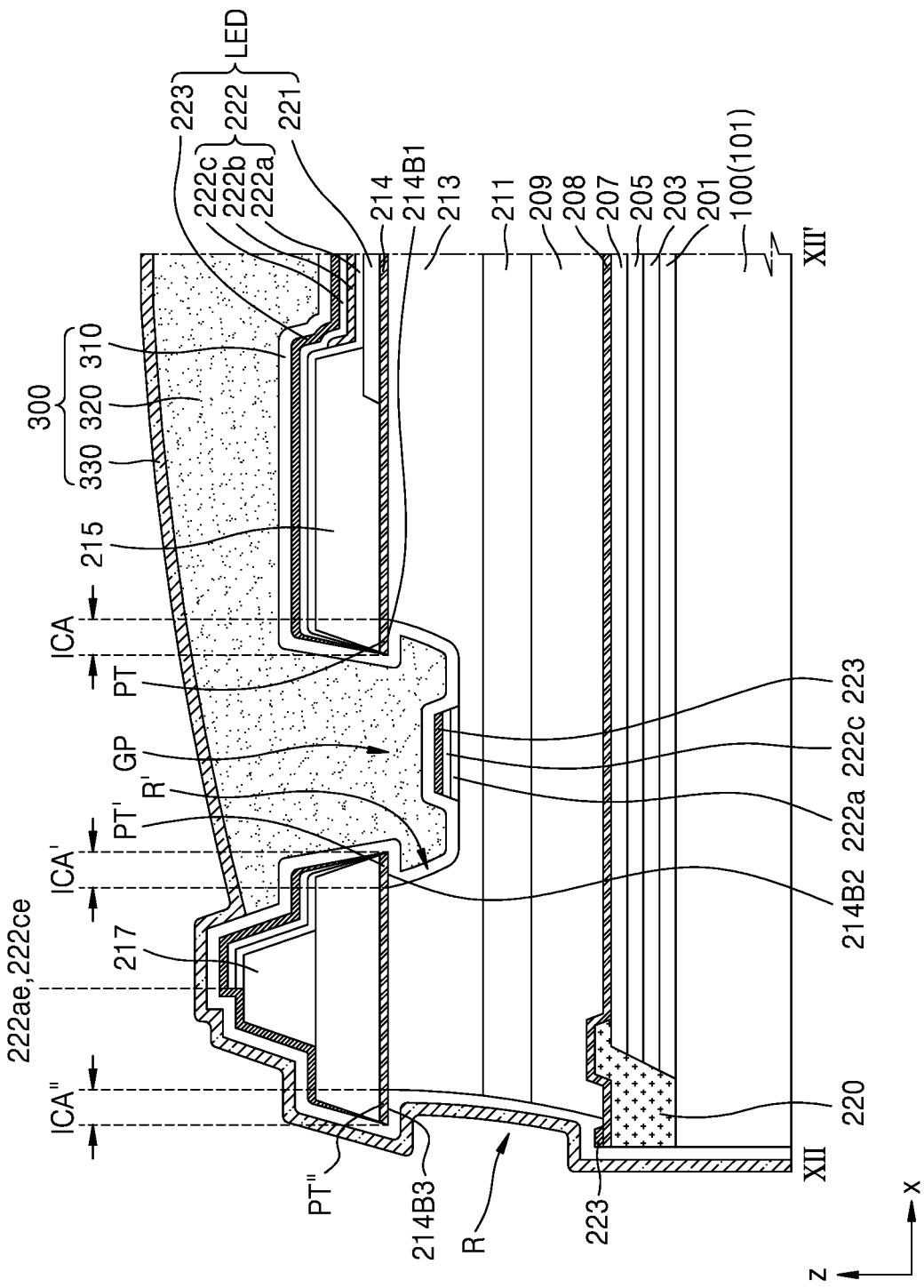
FIG. 12 shows a schematic cross-sectional view of a display device according to an embodiment, and corresponds to a cross-section taken along line XII-XII' of FIG. 11.

FIG. 12 is a schematic cross-sectional view of a display device according to an embodiment, and may correspond to a cross-section taken along line XII-XII' of FIG. 11.

Referring to FIG. 12, insulating layers such as the buffer layer 201, the gate insulating layer 203, the first interlayer insulating layer 205, the second interlayer insulating layer 207, the first inorganic insulating layer 208, the first organic insulating layer 209, the second organic insulating layer 211, and the third organic insulating layer 213 may be formed or disposed on the island portion 101 of the substrate 100.

An edge of each of the buffer layer 201, the gate insulating layer 203, the first interlayer insulating layer 205, and the second interlayer insulating layer 207 may be located or disposed inward from the edge of the island portion 101 and may be covered by an organic material layer 220.

The gap portion GP may be located or disposed between the first inorganic contact area ICA and the second inorganic contact area ICA'. The gap portion GP may be a type of groove in which an overhang structure or structures may be formed at sides thereof about a virtual vertical line passing through the center of the gap portion GP.

Overhang structures may be formed at sides with respect to the center of the gap portion GP. For example, ends of the third inorganic insulating layer 214 may protrude further toward the center of the gap portion GP than the side surface of the third organic insulating layer 213, which may be located or disposed below the third inorganic insulating layer 214 and may define a recess R', to form the tips PT and PT'. As described above, the first functional layer 222a, the second functional layer 222c, and the opposite electrode 223 may be disconnected or separated by the overhang structure or structures located or disposed at sides of the gap portion GP.

The recess R' of the third organic insulating layer 213 corresponding to the gap portion GP may have a concave shape in the thickness direction of the third organic insulating layer 213, as illustrated in FIG. 12. As illustrated in FIG. 12, the recess R' may not penetrate the third organic insulating layer 213, and the depth of the recess R' may be less than the thickness of the third organic insulating layer 213. According to another embodiment, the recess R' may penetrate the third organic insulating layer 213, for example, as described above with reference to FIG. 7.

The first inorganic encapsulation layer 310 may directly contact bottom surfaces 214B1 and 214B2 of the tips PT and PT' to form the first inorganic contact area ICA and the second inorganic contact area ICA', respectively.

For example, the bottom surface 214B1 of the third inorganic insulating layer 214 corresponding to the tip PT located or disposed inside the gap portion GP may contact or directly contact the first inorganic encapsulation layer 310, and thus the first inorganic contact area ICA may be formed. The bottom surface 214B2 of the third inorganic insulating layer 214 corresponding to the tip PT' located or disposed inside the gap portion GP may contact or directly contact the first inorganic encapsulation layer 310, and thus the second inorganic contact area ICA' may be formed.

The third inorganic contact area ICA" spaced apart from the second inorganic contact area ICA' about the spacer 217 may be formed while a bottom surface 214B3 of a tip PT''' of the third inorganic insulating layer 214 protruding in a direction away from the center of the island portion 101 contacts the first inorganic encapsulation layer 310. The tip PT" of the third inorganic insulating layer 214 extending away from the center of the island portion 101 may further protrude in a horizontal direction than the side surfaces of the first to third organic insulating layers 209, 211 and 213 that may be arranged below the third inorganic insulating layer 214 and may define a recess R.

The opposite electrode 223 may be disconnected by the recess R below the third inorganic contact area ICA". In this regard, FIG. 12 illustrates that a portion of the opposite electrode 223 may be arranged on the first inorganic insulating layer 208.

The organic encapsulation layer 320 of the encapsulation layer 300 may fill at least a portion of the gap portion GP. An edge of the organic encapsulation layer 320 may be located or disposed inside the spacer 217. The second inorganic encapsulation layer 330 may extend beyond the edge of the organic encapsulation layer 320 toward the edge of the first inorganic encapsulation layer 310. The second inorganic encapsulation layer 330 and the first inorganic encapsulation layer 310 may contact each other on the spacer 217 and/or on a side of the display device.

The light-emitting diode LED may have a stacked structure including the pixel electrode 221, the intermediate layer 222, and the opposite electrode 223. The edges 222ae and 222ce of the first functional layer 222a and the second functional layer 222c arranged below and above the emission layer 222b of the intermediate layer 222 may be arranged on the spacer 217. A detailed description thereof are described, for example, above with reference to FIG. 7.

As shown in FIG. 12, the encapsulation layer 300 may include the first and second inorganic encapsulation layers 310 and 330 and the organic encapsulation layer 320. However, in other embodiments, the organic encapsulation layer 320 of the encapsulation layer 300 may be omitted. For example, the encapsulation layer 300 may include only one or more inorganic encapsulation layers. However, the embodiments are not limited thereto.

Figure 13:
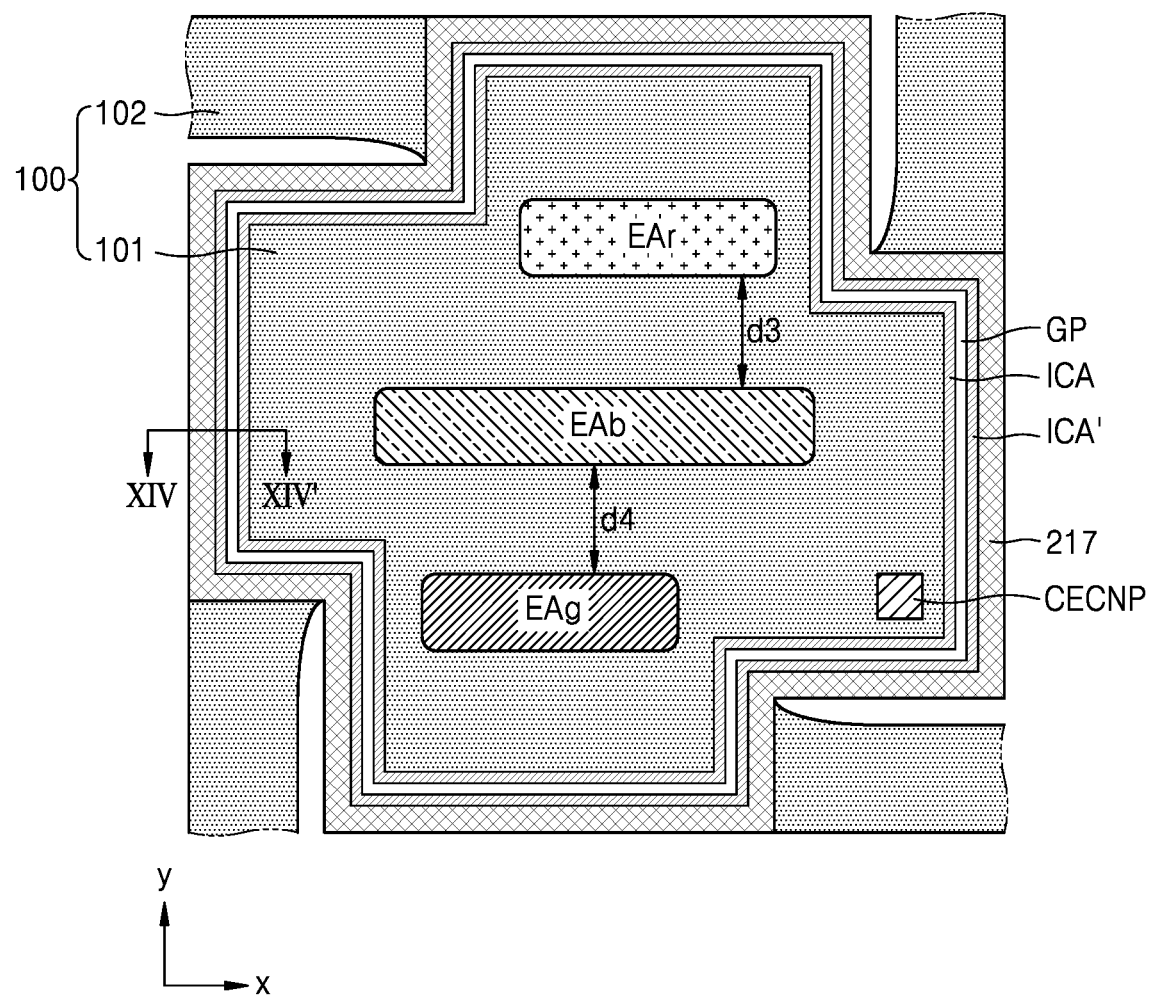
FIG. 13 is a plan view of a structure of a basic unit of a display device according to an embodiment.
Figure 14:
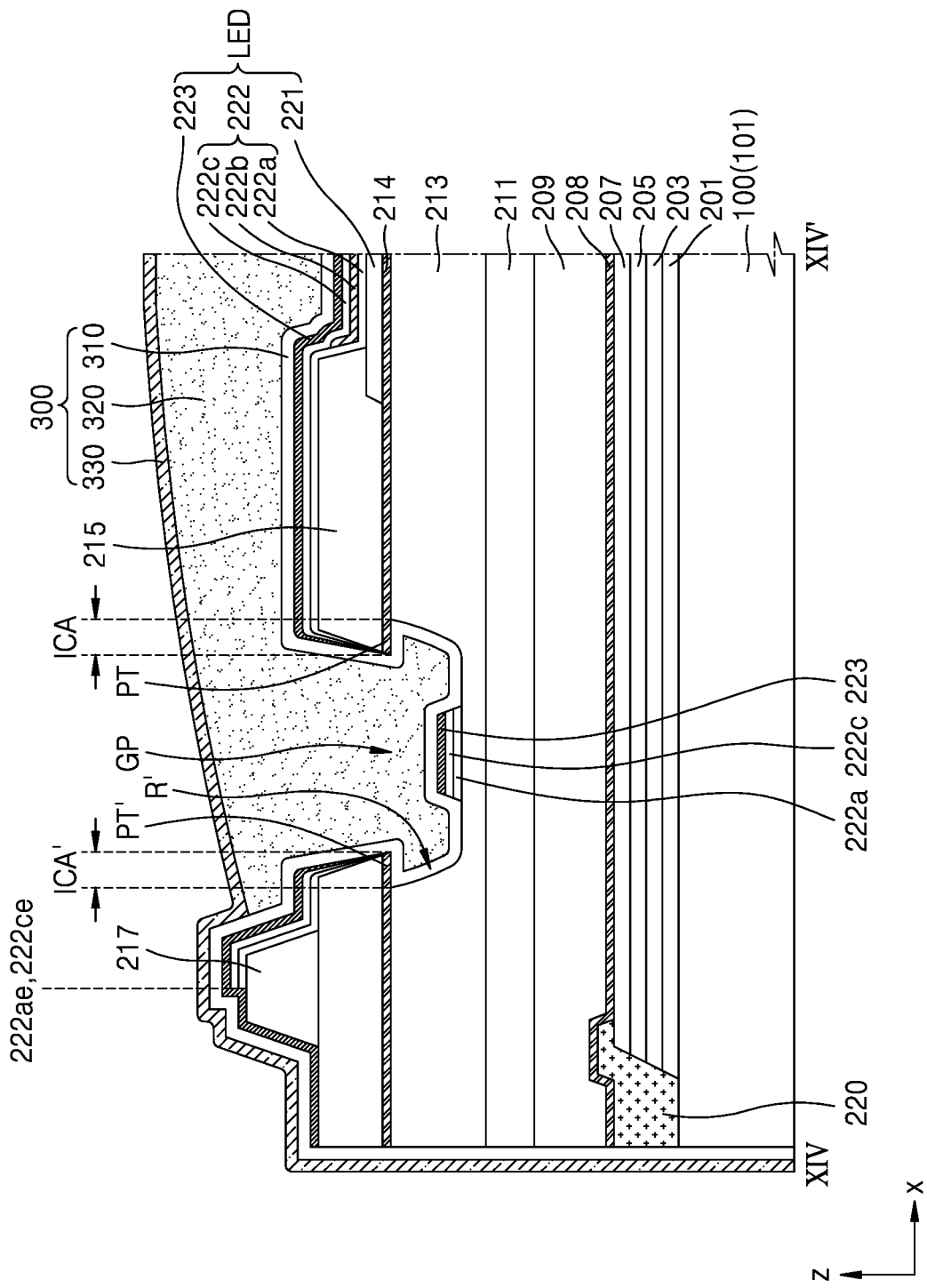
FIG. 14 shows a schematic cross-sectional view of a display device according to an embodiment, and corresponds to a cross-section taken along line XIV-XIV' of FIG. 13.

FIG. 13 is a plan view of a structure of a basic unit of a display device according to an embodiment, and FIG. 14 shows a schematic cross-sectional view of a cross-section taken along line XIV-XIV' of FIG. 13.

Referring to FIG. 13, the red emission area EAr, the blue emission area EAb, and the green emission area EAg may be located or disposed on the island portion 101 of the substrate 100. As described above, the island portion 101 may be connected to neighboring island portions through the connection portions 102 that may be integrally formed with the island portion 101 and extending from an edge or edges of the island portion 101.

In a planar perspective, the island portion 101 may be surrounded or entirely surrounded by the spacer 217, and the gap portion GP may be arranged inside or alongside the spacer 217.

The first inorganic contact area ICA may be arranged inside or alongside the gap portion GP, and the second inorganic contact area ICA' may be arranged outside or alongside the gap portion GP. The first inorganic contact area ICA and the second inorganic contact area ICA' may be spaced apart from each other with the gap portion GP therebetween.

Unlike the display device described with reference to FIG. 11, the display device illustrated in FIG. 13 may not include a third inorganic contact area ICA" as illustrated in FIG. 11.

According to an embodiment, as illustrated in FIG. 14, for example, edges of insulating layers arranged on the substrate 100 may be arranged on the same vertical line as the edge of the island portion 101 of the substrate 100. A side surface of the substrate 100 (for example, a surface of the island portion 101), side surfaces of the insulating layers on the substrate 100 (for example, a side surface of the organic material layer 220, side surfaces of the first to third organic insulating layers 209, 211, and 213, and a side surface of the third inorganic insulating layer 214), and a side surface of the pixel-defining layer 215 may be covered with the first and second inorganic encapsulation layers 310 and 330. Unlike the display device described with reference to FIG. 12, the display device illustrated in FIG. 14 may not include a third inorganic contact area ICA" as illustrated in FIG. 12. However, features of other components may be the same as or similar to those described with reference to FIG. 12. In this regard, in FIG. 14, the same reference numerals are used for the same components as those illustrated in FIG. 12.

Figure 15:
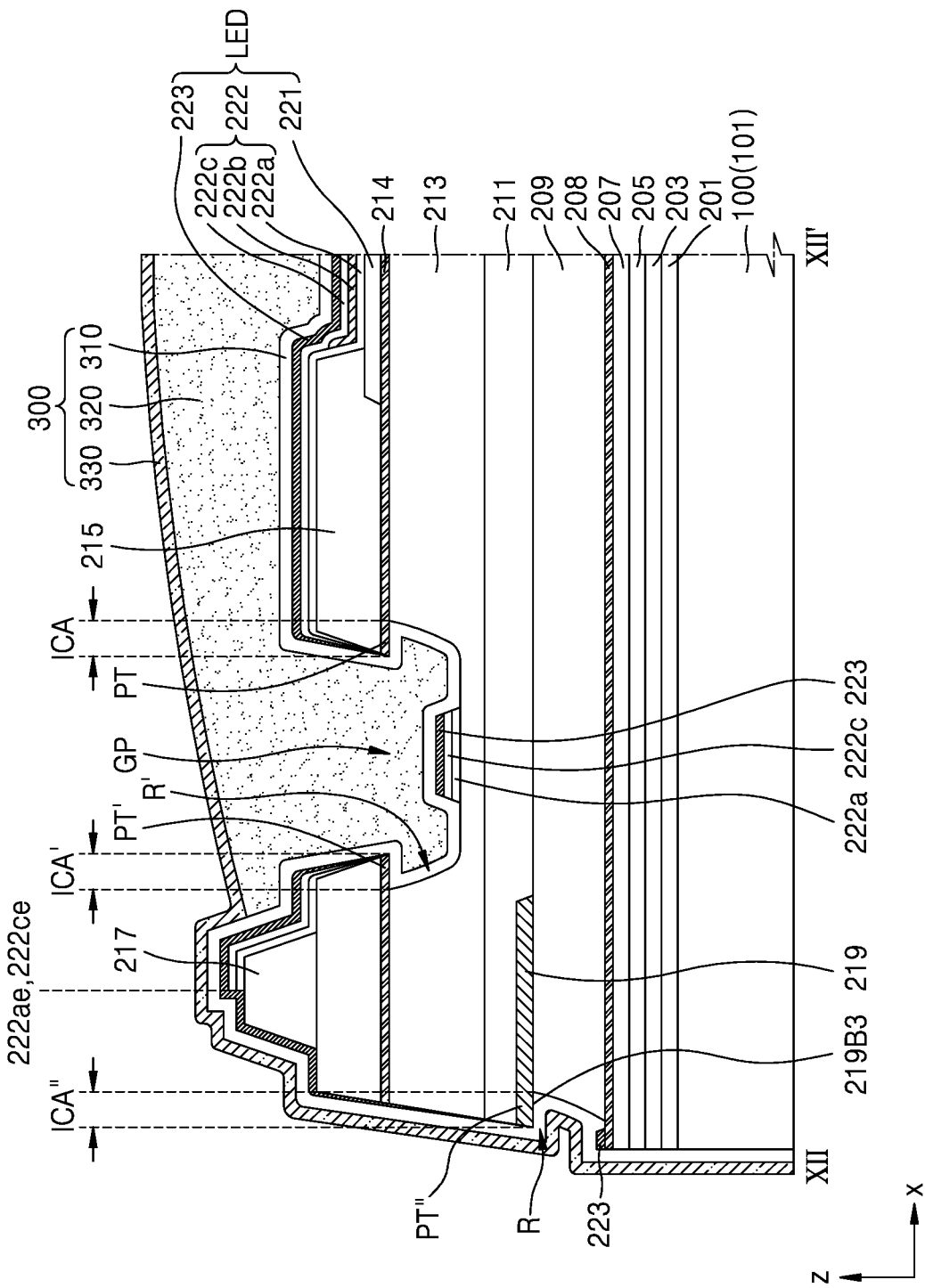
FIG. 15 is a schematic cross-sectional view of a display device according to an embodiment.

FIG. 15 is a schematic cross-sectional view of a display device according to an embodiment, and may correspond to a schematic cross-section taken along line XII-XII' of FIG. 11.

Referring to FIG. 15, a structure associated with a third inorganic contact area ICA" may be different from that described with reference to FIG. 12. Hereinafter, among the components of FIG. 15, the same components as those of FIG. 12 are shown in FIG. 15 using the same reference numerals, and the following description will be made based on differences for convenience of description.

Referring to FIG. 15, the third inorganic contact area ICA" may be formed using a layer 219 between the island portion 101 of the substrate 100 and the pixel electrode 221. The layer 219 may include an inorganic insulating layer including an inorganic insulating material such as silicon oxide, silicon oxynitride, or silicon nitride, or may include a metal layer including metal. The metal layer included in the layer 219 may include metal elements that may not include carbon, for example, molybdenum, titanium, and/or aluminum. The metal layer may be classified as an inorganic material layer because it may not include carbon. The layer 219 may be of the same or similar material as the spacer 217. As described above, the spacer 217, may include the same material and may be formed in a same mask process that may be used for forming the pixel-defining layer 215.

A recess R formed as a portion of the first organic insulating layer 209 may be etched. The recess R may be arranged below the layer 219. The layer 219 may protrude further in the horizontal direction than the side surface of the first organic insulating layer 209, which may define the recess R, to form a tip PT".

The opposite electrode 223 may be disconnected by an overhang structure or structures formed as a portion of the layer 219, for example, an edge of the layer 219 may protrude further than the side surface of the first organic insulating layer 209. In this regard, FIG. 15 illustrates that a portion of the opposite electrode 223 may be arranged on the bottom surface of the recess R, for example, on the first inorganic insulating layer 208.

A bottom surface 219B3 of the tip PT" of the layer 219 may contact or directly contact the first encapsulation layer 310. A contact portion between the bottom surface 219B3 of the layer 219 and the first encapsulation layer 310 may form a third inorganic contact area ICA". When the layer 219 includes an inorganic insulating material, a contact portion (for example, the third inorganic contact area ICA") between the layer 219 and the first inorganic encapsulation layer 310 may include a contact between inorganic insulating materials. The layer 219 may include a metal as described above. The metal may be classified as an inorganic material because it may not include carbon, and thus, the contact portion (for example, the third inorganic contact area ICA") between the layer 219 and the first inorganic encapsulation layer 310 may include a contact between an inorganic insulating material and a metal.

FIG. 15 illustrates that the tips PT and PT' protruding toward the center of the gap portion GP may be portions of the third inorganic insulating layer 214 and the tips PT and PT' of the third inorganic insulating layer 214 may contact the first inorganic encapsulation layer 310. As an embodiment, referring to FIG. 16, the tips PT and PT' protruding toward the center of the gap portion GP may be portions of the layer 219.

Figure 16:
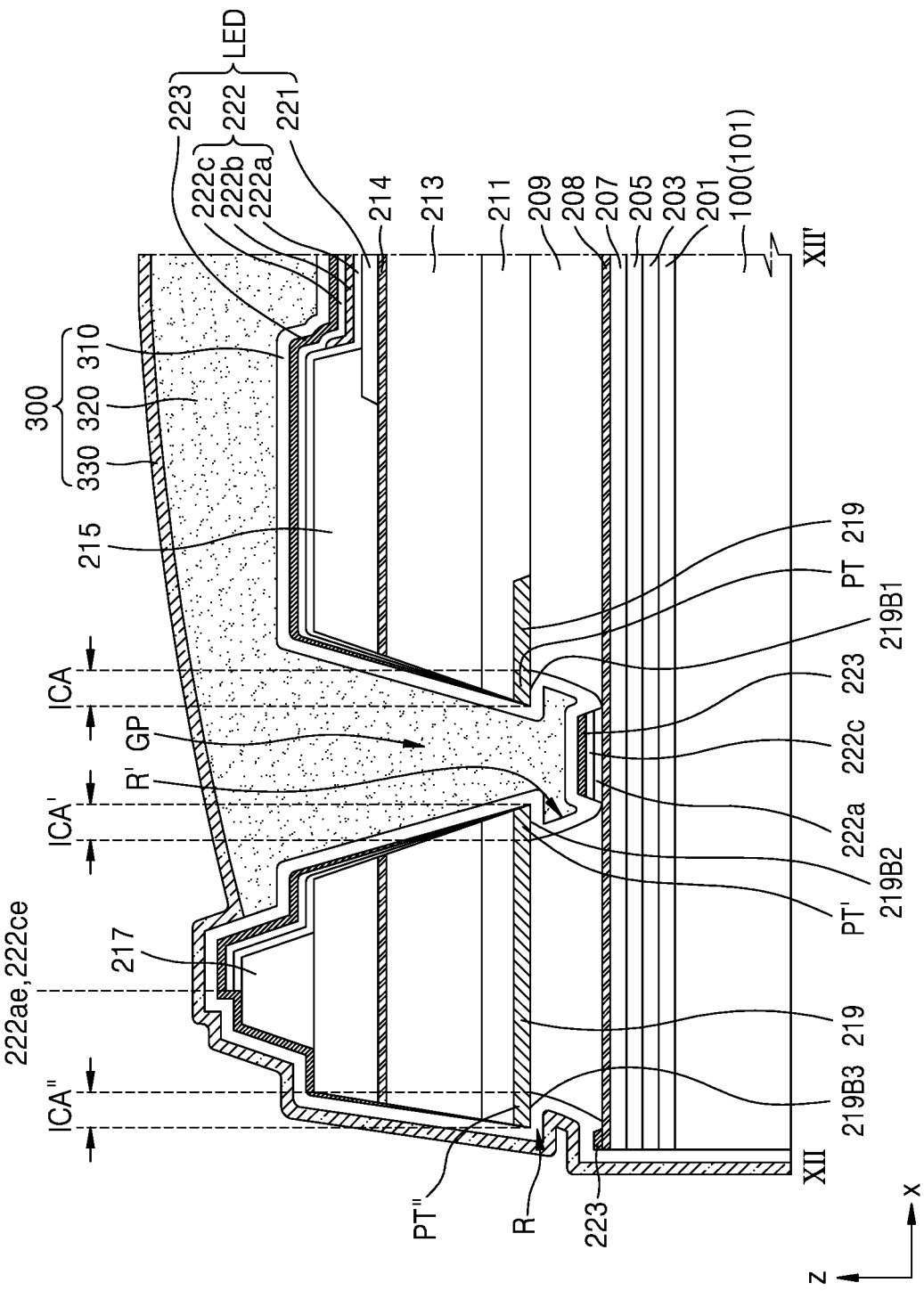
FIG. 16 is a schematic cross-sectional view of a display device according to an embodiment.

FIG. 16 is a schematic cross-sectional view of a display device according to an embodiment, and may correspond to a schematic cross-section taken along line XII-XII' of FIG. 11. Hereinafter, among the components of FIG. 16, the same components as those of FIG. 12 may be shown in FIG. 16 using the same reference numerals, and the following description will be made based on differences for convenience of description.

Referring to FIG. 16, a layer 219 may include a hole overlapping the gap portion GP. The layer 219 defines the hole in the layer 219 and may include tips PT, PT', and PT".

For example, the layer 219 may have a pair of tips PT and PT' extending toward the center of the gap portion GP, and a tip PT" extending toward an edge of a substrate 100, for example, the island portion 101. The structure of the tip PT" extending toward the edge of the island portion 101 (or extending horizontally in a direction away from the center of the island portion 101) is as described with reference to FIG. 15.

The pair of tips PT and PT' extending toward the center of the gap portion GP extends in the horizontal direction and may protrude further toward the center of the gap portion GP than a side surface of at least one layer (for example, the first organic insulating layer 209) arranged directly below the tips PT and PT'. Here, the side surface of the first organic insulating layer 209 may represent the side surface of the first organic insulating layer 209 defining a recess R'.

At least one organic layer provided in the intermediate layer 222, for example, the first functional layer 222a and/or the second functional layer 222c, may be disconnected by an overhang structure or structures formed as the portions of the layer 219, for example, the pair of tips PT and PT', may protrude further than a side surface of the first organic insulating layer 209. Similarly, the opposite electrode 223 may also be disconnected by the overhang structure or structures described above.

Recesses R and R' of the first organic insulating layer 209 may be formed while at least a portion of the first organic insulating layer 209 may be removed in the thickness direction of the first organic insulating layer 209. Depending on the degree of removal of the first organic insulating layer 209 in the thickness direction, the depths of the recesses R and R' may be equal to or less than the thickness of the first organic insulating layer 209.

The gap portion GP may be formed while a stacked structure including the first organic insulating layer 209, the layer 219, the second organic insulating layer 211, the third organic insulating layer 213, the third inorganic insulating layer 214, and the pixel-defining layer 215 may be removed in the thickness direction of the stacked structure. In an embodiment, the gap portion GP may have a structure in which a recess R' of the first organic insulating layer 209, a hole through the layer 219, a hole through the second organic insulating layer 211, a hole through the third organic insulating layer 213, a hole through the third inorganic insulating layer 214, and a hole through the pixel-defining layer 215 may overlap each other in a vertical direction.

A first inorganic encapsulation layer of the encapsulation layer 300 may contact or directly contact bottom surfaces 219B1, 219B2, and 219B3 of the tips PT, PT', and PT" of the layer 219 to form first to third inorganic contact areas ICA, ICA', and ICA", respectively.

FIGS. 15 and 16 illustrate that the layer 219 may be arranged below the pixel electrode 221 and may be arranged on the first organic insulating layer 209. However, in other embodiments, the layer 219 may be arranged on the second organic insulating layer 211 or on the third organic insulating layer 213.

FIGS. 15 and 16 illustrate the first to third inorganic contact areas ICA, ICA', and ICA". However, in other embodiments, one of the first to third inorganic contact areas ICA, ICA', and ICA" may be omitted. For example, as described above with reference to FIGS. 13 and 14, the third inorganic contact area ICA" may be omitted.

FIGS. 15 and 16 illustrate that the encapsulation layer 300 may include the first and second inorganic encapsulation layers 310 and 330 and the organic encapsulation layer 320. However, in other embodiments, the organic encapsulation layer 320 of the encapsulation layer 300 may be omitted. For example, the encapsulation layer 300 may include only one or more inorganic encapsulation layers. However, the disclosure is not limited thereto.

According to the one or more of the described embodiments, a configuration for encapsulating a display unit may be provided. Accordingly, a portion of an inorganic insulating layer may have an overhang portion. Also, a spatial usability of a substrate may be improved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device, comprising:
   a substrate including an island portion and at least one connection portion extending from the island portion;
   a display unit on the island portion, the display unit including at least one display element; and
   an encapsulation layer covering the at least one display element and including an inorganic encapsulation layer and an organic encapsulation layer, wherein
   the display unit includes:
      at least one organic insulating layer; and
      an inorganic insulating layer on the at least one organic insulating layer, the inorganic insulating layer having a tip protruding beyond a side surface of the at least one organic insulating layer, in a direction parallel to an upper surface of the substrate, and
   a portion of the inorganic encapsulation layer extends toward a bottom surface of the tip to overlap the bottom surface of the tip of the inorganic insulating layer.

2. The display device of claim 1, wherein the portion of the inorganic encapsulation layer directly contacts the bottom surface of the tip of the inorganic insulating layer.

3. The display device of claim 2, wherein the portion of the inorganic encapsulation layer further extends from the bottom surface of the tip and covers the side surface of the at least one organic insulating layer and a side surface of the substrate.

4. The display device of claim 2, wherein the at least one display element includes:
   a pixel electrode on the inorganic insulating layer;
   a pixel-defining layer on the pixel electrode, the pixel-defining layer having an opening overlapping the pixel electrode;
   an intermediate layer having an emission layer overlapping the pixel electrode; and
   an opposite electrode on the intermediate layer.

5. The display device of claim 4, wherein the opposite electrode covers the island portion.

6. The display device of claim 4, wherein the intermediate layer includes at least one functional layer between the pixel electrode and the opposite electrode.

7. The display device of claim 4, wherein an area where the portion of the inorganic encapsulation layer and the bottom surface of the tip of the inorganic insulating layer directly contact each other is an inorganic contact area that is around the at least one display element.

8. The display device of claim 7, further comprising:
   a spacer on the island portion, wherein
   a portion of the inorganic contact area is between the spacer and the at least one display element.

9. The display device of claim 8, wherein
   the inorganic insulating layer has a second tip protruding beyond the side surface of the at least one organic insulating layer,
   the inorganic encapsulation layer directly contacts the second tip of the inorganic insulating layer, and
   an area where the inorganic encapsulation layer and the second tip of the inorganic insulating layer directly contact each other is a second inorganic contact area that is apart from the inorganic contact area and is around the spacer, in a plan view.

10. The display device of claim 7, further comprising:
    a power voltage supply line on the island portion, wherein
    a contact portion between the opposite electrode and the power voltage supply line is inside an area within the inorganic contact area.

11. The display device of claim 10, wherein the power voltage supply line extends from the island portion onto the at least one connection portion.

12. The display device of claim 11, further comprising
    a second inorganic insulating layer between the island portion and the at least one connection portion,
    wherein the second inorganic insulating layer covers a portion of an upper surface of the power voltage supply line, and overlaps the inorganic contact area.

13. The display device of claim 1, wherein
    the at least one display element includes a first display element emitting red light, a second display element emitting blue light, and a third display element emitting green light, and
    the tip of the inorganic insulating layer is around the first display element, the second display element, and the third display element, according to a plan view.

14. The display device of claim 1, wherein
    the substrate includes repeatedly arranged basic units that each include the island portion and the at least one connection portion, and
    a closed line is formed between adjacent basic units from among the basic units, wherein the closed line defines a distance area in which portions of the island portion and portions of the at least one connection portion are absent.

15. A display device, comprising:
    a substrate;
    a plurality of display units on the substrate and being apart from one another; and
    an encapsulation layer on the plurality of display units, the encapsulation layer including an inorganic encapsulation layer and an organic encapsulation layer, wherein
    the substrate includes a plurality of island portions which are apart from one another and a plurality of connection portions connecting adjacent island portions, and
    the plurality of display units are each arranged on a corresponding island portion, wherein a first display unit arranged on a first island portion from among the plurality of island portions comprises:
       a pixel circuit including a thin-film transistor and a storage capacitor;

at least one organic insulating layer on the pixel circuit;
an inorganic insulating layer on the at least one organic insulating layer; and
a display element electrically connected to the pixel circuit and including a pixel electrode, an intermediate layer including an emission layer, and an opposite electrode, wherein
the inorganic insulating layer includes a tip protruding beyond a side surface of the at least one organic insulating layer in a direction parallel to an upper surface of the substrate, a portion of the inorganic encapsulation layer extends toward a bottom surface of the tip to overlap the bottom surface of the tip of the inorganic insulating layer.

16. The display device of claim 15, wherein the portion of the inorganic encapsulation layer directly contacts the bottom surface of the tip of the inorganic insulating layer.

17. The display device of claim 16, wherein the portion of the inorganic encapsulation layer further extends from the bottom surface of the tip and covers the side surface of the at least one organic insulating layer and a side surface of the first island portion.

18. The display device of claim 16, wherein an area where the bottom surface of the tip of the inorganic insulating layer and the portion of the inorganic encapsulation layer directly contact each other is an inorganic contact area that is around the display element.

19. The display device of claim 18, wherein
the plurality of connection portions include a first connection portion connecting the first island portion and a second island portion adjacent to the first island portion, and
lines electrically connecting the first display unit and a second display unit on the second island portion are arranged on the first connection portion.

20. The display device of claim 19, wherein the lines overlap a portion of the inorganic contact area.

21. The display device of claim 20, wherein the lines include a power voltage supply line electrically connected to the opposite electrode.

22. The display device of claim 21, wherein a contact portion between the power voltage supply line and the opposite electrode is inside an area within the inorganic contact area.

23. The display device of claim 18, further comprising
a spacer on the first island portion, wherein
a portion of the inorganic contact area is between the spacer and the display element.

24. The display device of claim 23, wherein a portion of the inorganic insulating layer, which is between the first island portion and the spacer, includes a second tip protruding beyond the side surface of the at least one organic insulating layer in the direction parallel to the upper surface of the substrate, and
the inorganic encapsulation layer directly contacts the second tip to form a second inorganic contact area.

25. The display device of claim 24, wherein the second inorganic contact area is apart from the inorganic contact area and around the spacer, in a plan view.

26. The display device of claim 24, further comprising:
a groove between the inorganic contact area and the second inorganic contact area.

27. The display device of claim 26, wherein each of the tip and the second tip protrudes towards the center of the groove, and
the opposite electrode and at least one organic material layer included in the intermediate layer are each separated by the tip and the second tip.

28. The display device of claim 15, wherein a recess in a thickness direction of the at least one organic insulating layer is below the tip of the inorganic insulating layer.

29. The display device of claim 28, further comprising:
a second inorganic insulating layer overlapping the recess.

30. The display device of claim 29, wherein a bottom surface of the recess is on a same plane as an upper surface of the second inorganic insulating layer.

* * * * *